United States Patent
Mizutani et al.

[11] Patent Number: 5,907,405
[45] Date of Patent: May 25, 1999

[54] ALIGNMENT METHOD AND EXPOSURE SYSTEM

[75] Inventors: Shinji Mizutani; Nobutaka Magome, both of Kanagawa-ken, Japan

[73] Assignee: Nikon Corporation, Tokyo, Japan

[21] Appl. No.: 08/985,906

[22] Filed: Dec. 5, 1997

Related U.S. Application Data

[63] Continuation-in-part of application No. 08/705,091, Aug. 29, 1996, abandoned.

[30] Foreign Application Priority Data

| Sep. 1, 1995 | [JP] | Japan | ................................ | 7-225017 |
| Sep. 1, 1995 | [JP] | Japan | ................................ | 7-225018 |
| Dec. 6, 1996 | [JP] | Japan | ................................ | 8-342250 |

[51] Int. Cl.⁶ .................................................. G01B 11/00
[52] U.S. Cl. ........................ 356/399; 356/401; 356/373; 356/375
[58] Field of Search .................... 356/399, 401, 356/373, 375

[56] References Cited

FOREIGN PATENT DOCUMENTS 7-321030  8/1995  Japan .

*Primary Examiner*—Frank G. Font
*Assistant Examiner*—Reginald A. Ratliff
*Attorney, Agent, or Firm*—Armstrong, Westerman, Hattori, McLeland, & Naughton

[57] ABSTRACT

Alignment is performed with a high degree of accuracy by detecting an offset in the Z position of a wafer mark. A focal position detecting system of a multipoint type is provided which irradiates spot beams on a plurality of measurement points substantially equally distributed on the exposure field of an projection optical system and detects the heights or levels of the irradiated positions. An alignment illumination beam for detecting the position of the wafer mark is irradiated as a slit beam from an alignment sensor, and the spot beams are set so as to be overlaid with the irradiated position of the slit beam. A sample shot where the measured value of a level at the irradiated position of the spot beam exceeds an allowable range of the measured value of a level at another measurement point is excluded from alignment data, and the coordinate positions of each shot area on a wafer are calculated by an EGA method.

20 Claims, 11 Drawing Sheets

ALIGNMENT METHOD AND EXPOSURE SYSTEM

This is a continuation-in-part application of U.S. patent application Ser. No. 705,091, filed on Aug. 29th, 1996, now abandoned.

BACKGROUND OF THE INVENTION

The present invention relates to an alignment method used when patterns on a mask are transferred on a substrate such as a wafer in the lithographic process for fabricating, for example, semiconductor devices, charge coupled devices (CCDs), liquid crystal display devices, or thin-film magnetic heads and also relates to an exposure apparatus that uses the alignment method. The invention is particularly adapted to be applied to and suitable for the case where patterns on a mask are aligned with shot regions on a wafer, based on array coordinates predicted by using a statistical method.

A semiconductor device, for example, is formed by overlaying or superimposing a multilayer circuit pattern on a wafer. Therefore, when the second circuit pattern and the circuit patterns thereafter are exposed and transferred on the wafer, the alignment between patterns on the mask (or reticle) which are going to be exposed and each shot region or area on which a circuit pattern has already been defined, that is, wafer alignment has to be performed with a high degree of accuracy.

As an alignment sensor for wafer alignment, there is an alignment sensor of a laser step alignment (LSA) type in which a laser beam is irradiated on an alignment mark in the form of a dotted line (a row of a plurality of dots) on a wafer and the position of the mark is detected by using the beam diffracted or scattered by the mark, or a field image alignment (FIA) type in which the image data of an alignment mark, illuminated and imaged with light having a wide waveband width and emitted from a light source consisting of a halogen lamp, is processed and measured, or a laser interferometric alignment (LIA) type in which laser beams having identical frequencies or slightly different frequencies are irradiated on alignment marks in the form of diffraction grating on a wafer in two directions, two diffracted beams generated interfere with each other, and the position of the alignment mark is measured from the phase difference.

FIG. 1 shows the schematic structure of a projection exposure apparatus equipped with a conventional alignment sensor of the LSA type. In the figure the pattern of a reticle R is transferred on each shot region or area on a wafer W through an projection optical system PL. The wafer W is placed on a wafer stage (not shown) through a wafer holder (not shown). It is assumed that a Z-axis is taken parallel to an optical axis of the projection optical system PL, and a rectangular or orthogonal coordinate system on a plane perpendicular to the Z-axis is represented by an X-axis and a Y-axis. Alignment illumination light beams LX and LY from the LSA and through-the-lens (TTL) types of X-axis and Y-axis alignment sensors 11X and 11Y are irradiated as slit beams SBa and SBb on the edges of an exposure field IAR of the projection optical system PL through the projection optical system PL from the lower portion of the reticle R. With respect to an image formation plane of the projection optical system PL, a best focal plane of the alignment sensors 11X and 11Y is set at the same focal position.

In addition, a focal position detecting system of oblique incidence type which comprises a light emitting system LES and a light receiving system LRS is disposed. Measuring beams LE from the light emitting system LES are irradiated, in an oblique direction, as spot beams on a plurality of measurement points on the substantially central portion of the exposure field IAR, and the reflected beams from the plurality of measurement points are received by means of the light receiving system LRS. The plurality of spot beams are imaged again in the light receiving system LRS, and a plurality of focal signals corresponding to the lateral offset quantities of the images formed again are output. If the position (Z-position) of the wafer W in the direction of the optical axis of the projection optical system PL is changed, the lateral offset quantities in images which are again formed will change and therefore the Z-positions of the wafer W at the plurality of measurement points will be measured from the plurality of focal signals.

FIG. 2 shows the concrete dispositions on the exposure field IAR of the spot beams by means of the measuring beams LE emitted from the focal position detecting systems LES, LRS. As shown in FIG. 2, spot beams $5a$ through $5e$ are irradiated on five measurement points equally spaced on approximately the diagonal line of the exposure field IAR of the projection optical system PL of FIG. 1. The slit beams SBa and SBb created by the alignment illumination light beams LX and LY emitted from the alignment sensors 11X and 11Y of FIG. 1, are irradiated substantially on the centers of the edges in −Y and +X directions of the exposure field IAR.

An X-axis wafer mark WMa of LSA type and a Y-axis wafer mark WMb of LSA type are formed on the edge in the −Y direction (in FIG. 2 the lower edge) and edge in the +X direction (in FIG. 2 the right edge) of a shot region or area 8 enclosed by dotted lines on the wafer W, respectively. At the time of alignment, the wafer W is moved through a wafer stage (not shown) so that the wafer mark WMa crosses the slit beam SBa in the X direction and then it is moved through the wafer stage so that the wafer mark WMb crosses the slit beam SBb in the Y direction. With the movement of the wafer W, the X and Y coordinates of the wafer marks WMa and WMb are detected. Thereafter, at time of exposure, the center of the shot area 8 on the wafer W is aligned with the center (center of exposure) of the exposure field IAR and, based on the focal signals from the focal position detecting systems LES and LRS, the average Z-position of the shot area 8 is aligned with the image formation plane (previously obtained) of the projection optical system PL. In this way, the pattern images on the reticle R are exposed and transferred onto the shot area 8.

As shown in FIG. 2, the conventional focal position detecting system of oblique incidence type is contemplated to detect the average Z-position of the shot region at the time of exposure. For this reason, only five spot beams $5a$ through $5e$ are irradiated on the diagonal line on the exposure field IAR.

In the aforementioned prior art when the alignment of the shot area 8 on the wafer is performed, none of the five spot beams $5a$ through $5e$ are irradiated near the wafer marks WMa and WMb in the state where the wafer marks WMa and WMb have crossed the alignment slit beams SBa and SBb. Therefore, the Z-positions on the wafer marks WMa and WMb have not been detected at the time of alignment. For example, in the case where foreign substances such as resist dust particles exist between the wafer and the wafer holder, the Z-positions of the wafer marks WMa and WMb do not always match the best focal positions of the alignment sensors 11X and 11Y and therefore there is the fear that a focus offset will occur at the time of alignment. If the telecentric properties of the alignment sensors 11X and 11Y are lost when an offset such as this occurs, the disadvantage that errors (jump of data measured) will be contained in measured values will exist.

On the other hand, an autofocus device disposed in the conventional exposure apparatus is structured to perform focus measurement (a measurement of a location of a projection optical system on a wafer surface in a direction along an optical axis) within a range on the order of an exposure field size and adjust the position or level of the wafer surface in the direction along the optical axis to an average focal position within the range. Flatness of substrates such as wafers to be exposed can be measured using focus measurement results obtained with the autofocus device.

A degree of roughness of a wafer surface is changed by exposure and subsequent processes, and a step between an alignment mark (wafer mark) and a surrounding base may differ depending on a layer on the wafer. To perform accurate alignment by detecting a position or level of the alignment mark accurately, it is therefore necessary to align a detection region of the alignment sensor with a focal plane of an objective lens thereof (bring the objective lens into focus).

However, the conventional autofocus device which performs focus measurement within the range of the exposure field size and focuses to the average focal position within the exposure field size can hardly measure a true defocus quantity within a minute region on the order of a detection region of the alignment sensor and perform an accurate focus adjustment within this minute region.

Further, an exposure apparatus of a step-and-repeat type (or a step-and-scan type) adopts an enhanced global alignment method (hereinafter referred to as an EGA method), which in order to perform alignment between a projected image of a pattern on a reticle and a chip pattern on the shot region or area of a wafer, measures positions of alignment marks attached to a plurality of specific shots (sample shots) on a wafer such as those disclosed, for example, in Japanese Patent Laid-Open Publication No. Sho 61-44429 using an alignment sensor and determines array coordinates of all the shots on the wafer by statistical processing using the method of least squares on the basis of actually measured values and a design value of each shot array.

However, the conventional autofocus device can hardly measure a true defocus quantity within the minute region on the order of the detection region of the alignment sensor and adjust a focal position accurately within this minute region. Therefore, there may be caused an undesirable situation that, shot areas within which foreign matter such as dust adheres to surfaces thereof and shot areas having remarkable steps formed between marks (in case of multiple marks) within the alignment marks due to roughness on a surface of a wafer are selected as the sample shots. In such a case, the conventional autofocus device is inconvenient in that it involves errors in positional measurements of the alignment marks, thereby resulting in errors in shot array coordinates determined by the EGA method.

SUMMARY OF THE INVENTION

An object of the present invention is to provide an alignment method which, even when the Z-position (the position along the optical axis of the projection optical system) of a wafer mark (alignment mark) on a wafer is offset relative to another region of shot areas, is capable of accurately detecting the offset and performing alignment with a high degree of accuracy.

Another object of the present invention is to provide an alignment method which is capable of accurately detecting an offset and performing alignment with a high degree of accuracy, even when such an offset exists between a part of a surface of a photosensitive substrate and remaining portions thereof due to existence of a foreign matter adhered to the other surface of the photosensitive substrate.

Still another object of the present invention is to provide an exposure apparatus which is capable of exposing photosensitive substrates with a high accuracy with patterns on reticles by carrying out the alignment method described above.

A further object of the present invention is to provide an exposure apparatus which is capable of maintaining a throughput and an overlaying accuracy at high levels even when a foreign matter or the like is adhering to surfaces of photosensitive substrates.

A first alignment method, according to the present invention, for aligning each of a plurality of shot areas on a substrate with a predetermined coordinate system, the method comprises steps of: selecting a predetermined number of shot areas from the plurality of shot areas as sample shots; measuring the coordinate position of an alignment mark provided for each of the predetermined number of sample shots; irradiating, for every sample shot, a light beam to each of the measurement points which are set on a plurality of points on and around the alignment mark to measure the levels of the substrate at the plurality of measurement points; comparing, for every sample shot, the measured levels at the measurement points set on the alignment mark with the measured levels at the other measurement points and determining whether or not the measured levels at the measurement points set on the alignment mark have an error; and excluding one or more sample shots in which the measured levels at the measurement points set on the alignment mark have an error and calculating an array coordinate of the shot areas on the substrate based on the coordinated position of the other sample shots.

In one embodiment of the first method, it may further comprises a step of selecting a sample shot which is present around the excluded sample shot as a substitute shot.

In another embodiment of the first method, it may further comprises steps of: measuring the coordinate position of an alignment mark provided for the substitute shot; irradiating a light beam to each of measurement points which are set on a plurality of points on and around the alignment mark of the substitute shot to measure the levels of the substrate at the plurality of measurement points; and comparing the measured levels at the measurement point set on the alignment mark of the substitute shot with the measured levels at the other measurement points and determining whether or not the measured levels at the measurement points set on the alignment mark have an error.

In further embodiment of the first method, the substitute shot may be selected so that a radius of distribution, on the substrate, of the sample shot which is used for calculating the array coordinate is less than a predetermined radius.

In still another embodiment of the first method, the array coordinate of the shot area on the substrate may be calculated by statistically processing the coordinated position of the other sample shots.

In still another embodiment of the first method, if the difference between the measured levels at measurement points set on the alignment mark and the average of the measured levels at the other measurement points exceeds a predetermined allowable range, it may be determined that the measured levels at the measurement points on said alignment mark have an error.

In further embodiment of the first method, irradiation of the light beam and reception of the reflected light beam may be performed by way of an optical system which is the same as an objective system executing the step of detecting the coordinate position, and telecentricity of the reflected light beam may be destroyed at a stage to receive said reflected light beam.

A second alignment method, according to the present invention, for aligning a substrate comprises steps of: detecting the position of an alignment mark formed on the substrate; irradiating, for every sample shot, a light beam to each of the measurement points which are set on a plurality of points on and around the alignment mark to measure the levels of the substrate at the plurality of measurement points; comparing the measured levels at the measurement points set on the alignment mark with the measured levels at the other measurement points; and determining, based on the compared results, whether or not positional information of the alignment mark is used for alignment of the substrate.

In one embodiment of the second method, if the difference between the measured levels at measurement points set on the alignment mark and the average of the measured levels at the other measurement points exceeds a predetermined allowable range, it may be determined that the measured levels at the measurement points on the alignment mark have an error.

In another embodiment of the second method, irradiation of the light beam and reception of the reflected light beams may be performed by way of an optical system which is the same as an objective optical system executing the step of detecting the alignment mark, and telecentricity of said reflected light beam may be destroyed at a stage to receive said reflected light beam.

A third alignment method, according to the present invention, for aligning each of a plurality of shot areas on a substrate with a predetermined coordinate system, the method comprises steps of; selecting predetermined number of shot areas from the plurality of shot areas as sample shots; irradiating, for every sample shot, a light beam to each of the measurement points which are set on a plurality of points on and around the alignment mark to measure the levels of the substrate at said plurality of measurement points; comparing, for every sample shot, the measured levels at the measurement points set on the alignment mark with the measured levels at the other measurement points and determining whether or not the measured levels at the measurement points set on the alignment mark have an error; excluding one or more sample shots in which measured levels at the measurement points set on the alignment mark have an error and measuring the coordinate positions of the alignment marks of the other sample shots; and calculating an array coordinate of the shot areas on the substrate based on the measured coordinate position.

In one embodiment of the third method, it may further comprises a step of selecting a sample shot which exists around the excluded sample shot as a substitute shot.

In another embodiment of the third method, the array coordinate of the shot area on the substrate may be calculated by statistically processing the coordinate position of the other sample shots.

In further embodiment of the third method, if the difference between the measured levels at measurement points set on the alignment mark and an average of the measured levels at the other measurement points exceeds a predetermined allowable range, it may be determined that the measured levels at the measurement points on the alignment mark have an error.

A foruth alignment method, according to the present invention, for aligning a substrate having a plurality of alignment marks formed thereon, comprises steps of; measuring respective levels of the places where the alignment marks are formed; determining, based on the measured results, whether or not positional information of said alignment mark is used; and excluding one or more alignment makes which are determined not to be used, from the plurality of alignment marks and aligning the substrate based on the positional information of the other alignment marks.

An exposure apparatus, according to the present invention, for transferring a pattern on a mask to a photosensitive substrate comprises; an alignment system for detecting the position of an alignment mark by irradiating an alignment light beam to the alignment mark formed on the photosensitive substrate; a position detecting system irradiating measuring beams to the measurement points, respectively, which are set in a plurality of points on and around an illumination position of the alignment light and measuring levels of the photosensitive substrate at a plurality of measurement points, respectively; and a determining device for determining whether or not the measured levels at the measurement points set in the illumination position of the alignment light by comparing the measured levels at the measurement points set in the illumination position and the measured levels the other measurement points.

In one embodiment of the exposure apparatus, the position detecting system may perform irradiation of the light beam and reception of the reflected light beam by way of an optical system which is the same as an objective optical system of the alignment system, and telecentricity of the reflected light beam may be destroyed at a stage to receive the reflected light beam.

DESCRIPTION OF THE PREFERRED EMBODIMENTS

A preferred embodiment of the present invention will hereinafter be described in reference to FIGS. 3 through 5.

Figure 3:
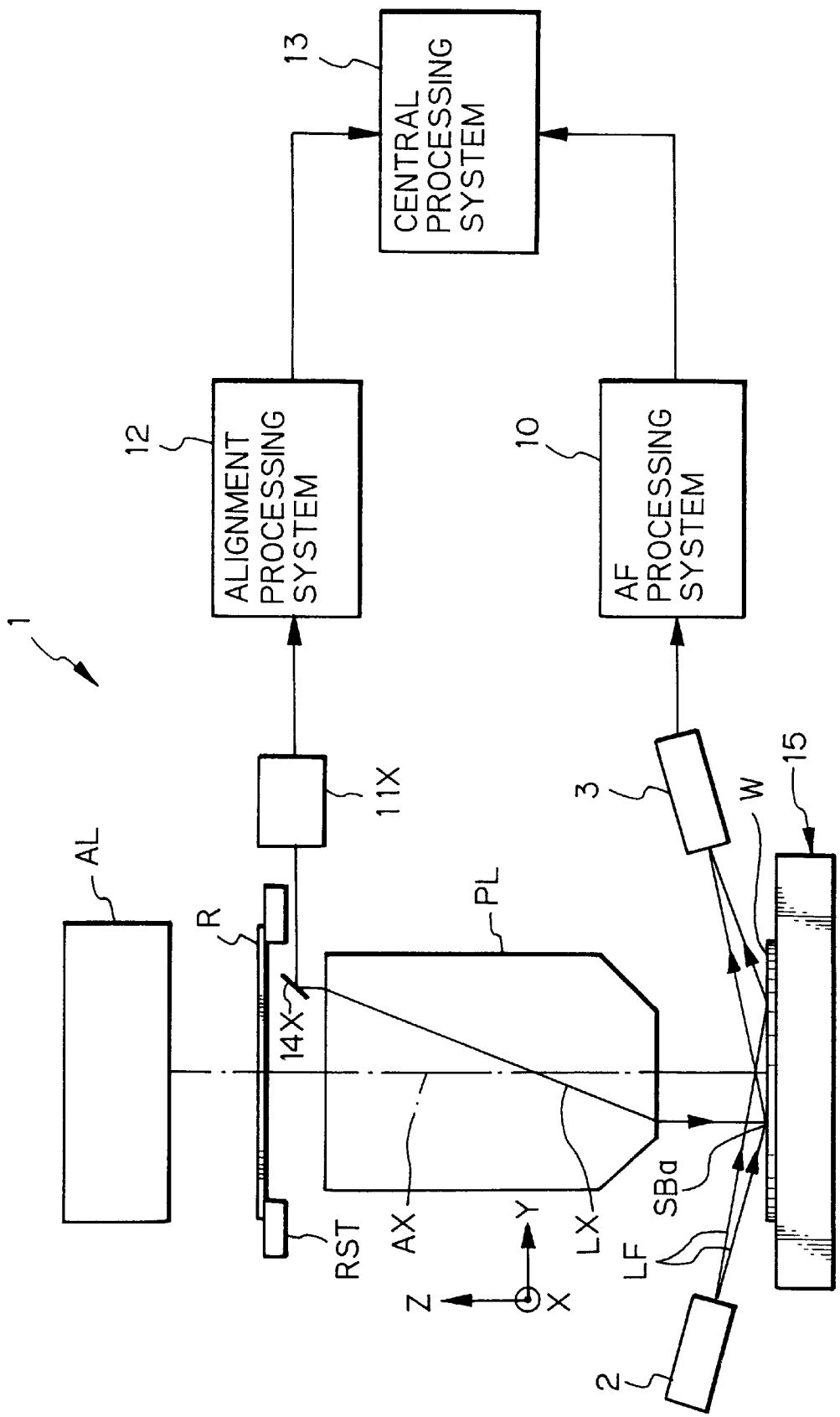
FIG. 3 is a schematic view of a projection exposure apparatus for carrying out an alignment method of the present invention.

FIG. 3 shows the schematic structure of the entire stepper type projection exposure apparatus 1 of this embodiment. In the figure, illumination light for exposure from an exposure illumination system AL is irradiated on a reticle R at the time of exposure, and patterns on the reticle R are scaled down, for example, to ⅕ through an projection optical system PL and are projected on shot regions or areas on a wafer W coated with photoresist. In this exposure apparatus, the Z axis is taken parallel to the optical axis AX of the projection optical system PL, the Y-axis is taken on a plane perpendicular to the Z-axis parallel to the surface of FIG. 3, and the X-axis is taken perpendicular to the surface of FIG. 3.

In this case the reticle R is held on a reticle stage RST, which positions the reticle R in the X and Y directions and rotational direction (θ direction) on a plane perpendicular to the optical axis AX of the projection optical system PL.

The wafer W, on the other hand, is placed on a wafer stage 15 through a wafer holder (not shown). The wafer stage 15 performs the positioning of the reticle R in the X and Y directions and rotational direction (θ direction) on the plane perpendicular to the optical axis AX of the projection optical system PL and also performs the positioning of the wafer W in the Z direction. The X and Y coordinates and rotational angle of the wafer W are detected at all times with a known method by a movable mirror (not shown) fixed on the wafer stage 15 and an external laser interferometer (not shown), and the measured values are supplied to a central control system 13. An X-axis wafer mark WMa in the form of a dotted row for X-axis alignment and a Y-axis wafer mark WMb in the form of a dotted row for Y-axis alignment (see FIG. 4(b)) are formed on each shot region of the wafer W (a representative shot region 8 is shown in FIG. 4(b)).

Also, in FIG. 3 an X-axis alignment sensor 11X of TTL type and LSA type is disposed near the upper side surface of the projection optical system PL and below the reticle state PST. The alignment sensor 11X is used for finally aligning the reticle R with each shot region on the wafer W. When wafer alignment is performed, the alignment illumination light beam LX emitted from the alignment sensor 11X is irradiated as a slit beam SBa on the wafer W through an upper mirror 14X and the projection optical system PL. If, in this state, the wafer stage 15 is driven so that, for example, the wafer mark WMa of FIG. 4(b) crosses the slit beam SBa in the X direction, a diffracted beam will be generated from the wafer mark WMa when the wafer mark WMa passes through the slit beam SBa. The dif-fracted beam from the wafer mark WMa returns to the incident optical path and is enters an internal light receiving sensor through the projection optical system PL and the alignment sensor 11X. The alignment sensor 11X photo-electrically converts a quantity of light which enters the light receiving sensor to a detection signal, and generates the signal. The detection signal is applied to an alignment processing system 12. In the alignment processing system 12 when the light quantity becomes maximum, the X coordinate of the wafer stage 15 is detected as the position of the wafer mark.

In addition, a Y-axis alignment sensor (not shown) similar to the alignment sensor 11X is provided. Illumination light beam from the Y-axis alignment sensor is irradiated as a slit beam SBb on the edge in the +X direction of an exposure field IAR, as shown in FIG. 4(b). The Y coordinate of the Y-axis wafer mark WMb on the wafer W, shown in FIG. 4(b), is measured by the Y-axis alignment sensor and the alignment processing system 12. The X and Y coordinates of the wafer mark detected by the alignment processing system 12 are supplied to a central control system 13, which performs the general control of the operation of the entire system. In addition, the best focal planes of the X-axis and Y-axis alignment sensors are set so that they coincide with the image formation plane of the projection optical system PL.

Figure 4A:
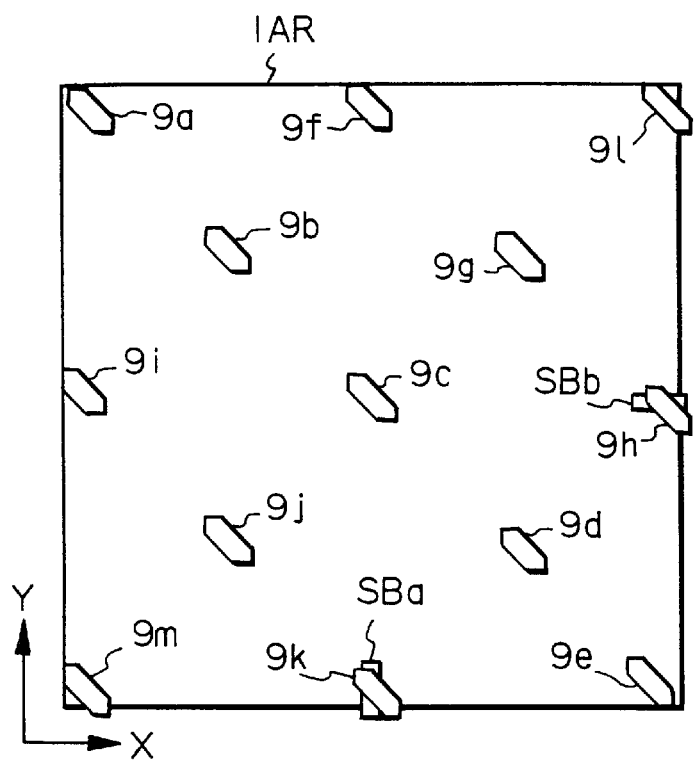
FIG. 4(a) is an enlarged plan view showing the relationship between the irradiated position of the alignment illumination light in the projection exposure apparatus of FIG. 3 and the spot light from the focal position detecting system.
Figure 4B:
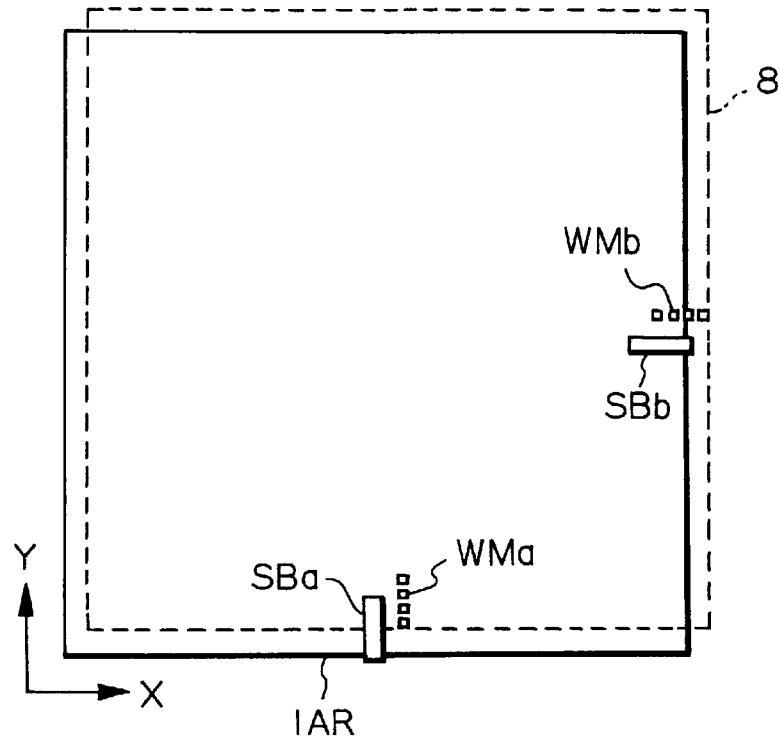
FIG. 4(b) is an enlarged plan view showing the relationship between the wafer mark provided on a shot area on a wafer and the irradiated position of the alignment illumination light.

In FIG. 4(b) the spacing between the X coordinate of the center (center of detection) of the slit beam SBa from the X-axis alignment sensor 11X and the X coordinate of the center (center of exposure) of the exposure field IAR, that is the base line quantity of the X-axis alignment sensor 11X, is previously obtained and stored in the central control system 13 of FIG. 3. In the same way, the base line quantity of the Y-axis alignment sensor (not shown), that is the spacing between the Y coordinate of the center of the slit beam SBb and the Y coordinate of the center of the exposure field IAR, is also stored in the central control system 13. Based on the coordinates of the base line quantities added to the X and Y coordinates of the wafer mark detected by the alignment sensor 11X, the center of each shot region or area is aligned with the center of the exposure field IAR when exposure is performed.

Figure 2:
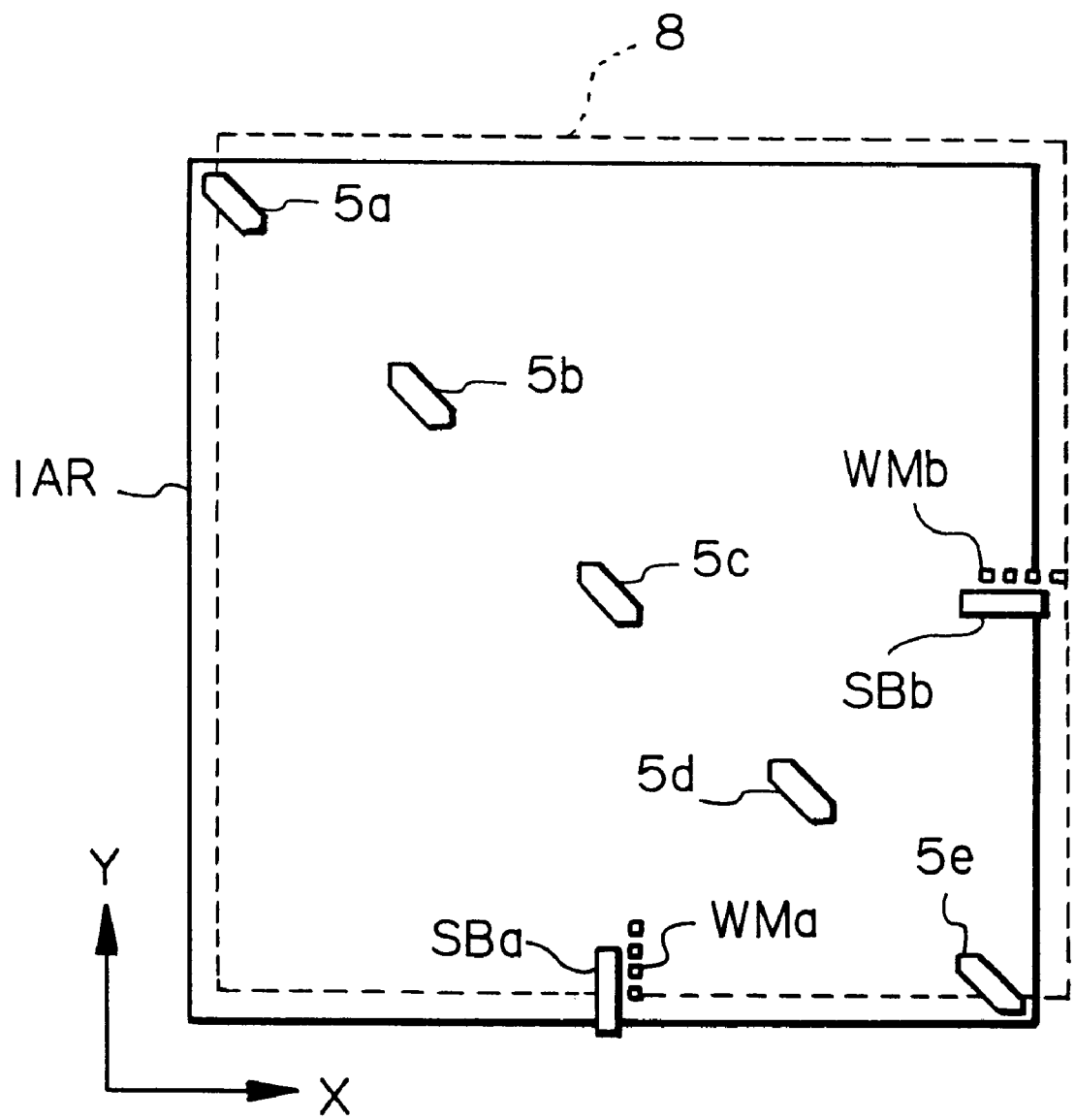
FIG. 2 is an enlarged plan view showing the relationship between the irradiated position of the alignment illumination light in the conventional projection exposure apparatus and the spot light from the focal position detecting system.

In addition, in the system of FIG. 3 there is disposed an oblique incidence multipoint type of focal point detecting system (hereinafter referred to as a "focal point detecting system 2, 3") which includes a light emitting system 2 and a light receiving system 3. The light emitting system 2 irradiates, in a diagonal direction, a plurality of measuring beams (hereinafter referred to as "AF beams") LF having a wavelength band to which a photoresist layer is less sensitive and forming a slit image (or pin hole image) obliquely on the exposure surface of the wafer W within the exposure field IAR of the projection optical system PL. The light receiving system 3 receives light beams of the AF beams LF, which are reflected at the exposed surface of the wafer W. As shown in FIG. 2, the conventional measuring beams of the focal position detecting system are irradiated on five measurement points arranged diagonally in the exposure field of the projection optical system, however, the AF beams LF of the focal position detecting system 2, 3 according to the present invention are irradiated on even more measurement points.

FIG. 4(a) shows the positions of slit spot beams which are obtained from the AF beams irradiated on 13 measurement points arrayed in the exposure field IAR of the projection optical system PL, and FIG. 4(b) shows the positional relationship, at the time of alignment, between the exposure field IAR of the projection optical system PL and the shot region or area 8 of the wafer W. As shown in FIG. 4(a), the AF beams LF are irradiated on 13 measurement points distributed substantially equally in the entire exposure field IAR, as slit-like spot beams 9a through 9m which extend and are arranged parallel to the diagonal line of the exposure field IAR. The spot beams 9f through 9m (measurement points) are disposed at positions which are symmetrical with respect to five spot beams 9a through 9e arranged on the diagonal line of the exposure field IAR at equal intervals. Among the spot beams 9a through 9m, the spot beam 9k on the edge in the Y direction is irradiated so that it is substantially overlaid on the slit beam SBa which is in the irradiated position of the alignment illumination light from the X-axis alignment sensor 11X. In addition, the spot beam 9h on the edge in the X direction is irradiated so that it is substantially overlaid on the slit beam SBb which is in the irradiated position of the alignment illumination light from the Y-axis alignment sensor.

In this case the images of the 13 spot beams 9a through 9m are again formed by the light receiving system 3, and 13 focal signals respectively corresponding to the lateral offset quantities of these images again formed are generated. These focal signals are supplied to an AF processing system 10, in which positions in the Z direction (Z positions) at the irradiated positions (measurement points) of the spot beams 9a through 9m are obtained. The focal positions are supplied to the central control system 13.

As shown in FIG. 4(b), the shot area 8 on the wafer W is assumed to be a shot area of an object of measurement. When alignment is performed in the X direction, the wafer stage 15 on which the wafer W of FIG. 3 is mounted is scanned in the X direction by using the X-axis alignment sensor 11X, and the wafer mark WMa crosses the slit beam SBa. At this time, the Z position of the wafer mark WMa is detected by the AF processing system 10. In addition, when alignment is performed in the Y direction, the Y-axis alignment sensor is used, and when the wafer mark WMb crosses the slit beam SBa, the Z position of the wafer mark WMb is detected by the AF processing system 10.

The alignment method of the embodiment according to the present invention will next be described.

Figure 1:
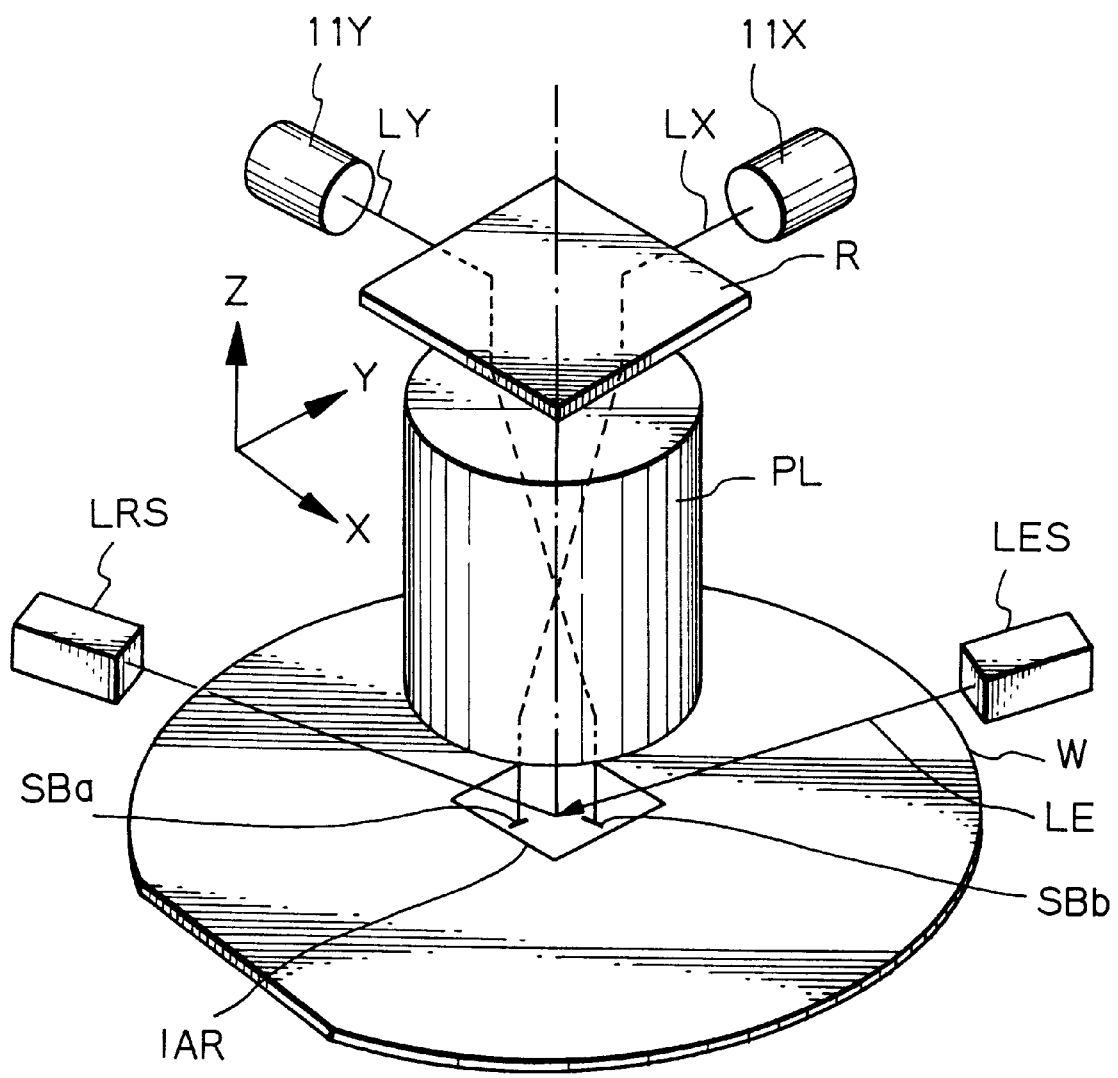
FIG. 1 is a schematic view showing an example of a conventional projection exposure apparatus.

This embodiment employs an enhancement global alignment (EGA) method disclosed, for example, in U.S. Pat. Nos. 4,780,617 and 4,833,621, and wafer alignment is performed by using X-axis and Y-axis alignment sensors 11X and 11Y such as those shown in FIG. 1. That is, the positions of the wafer mark of a predetermined number of shot areas (sample shots) selected from all shot areas on the wafer W are measured and the array coordinates of all shot areas on the wafer W are calculated by statistically processing the measurement result of these sample shots. FIG. 5 shows an example of a shot array on the wafer W. The coordinates of the wafer marks provided for N (in FIG. 5, N=9) sample shots 7A through 7I which are selected from all the shot regions on the wafer W and designated by hatched areas in FIG. 5, are measured.

When wafer alignment is performed, the measured values of the coordinates of the wafer marks of the sample shots 7A through 7I are supplied from the alignment processing system 12 to the central control system 13 of FIG. 3. At the same time, the Z points at the irradiated positions (measurement points) of the spot beams 9a through 9m of FIG. 4(a), measured by the focal position detecting system 2, 3 when the wafer mark is overlaid on the slit beam SBa (or SBb) emitted from the alignment sensor, are supplied to the central control system 13 through the AF processing system 10. These measured values of each sample shot are stored in the central control system 13. Assume now that the Z positions, which are measured at the irradiated positions of the spot beams 9a through 9m of FIG. 4(a) when the sample shot 7A of FIG. 5 is measured, are $f_a$ through $f_m$, respectively. That is, the Z positions, which are measured by the spot beams 9k and 9h irradiated so as to be substantially overlaid on the irradiated positions on which the slit beams SBa and SBb from the alignment sensors are irradiated, are represented by $f_k$ and $f_h$.

Thereafter, when statistical processing is performed by the EGA method, a difference between the Z position $f_k$ at the irradiated position of the spot beam 9k and the average value F $(=(f_a+f_b+...+f_m)/(N-2))$ of the Z positions at the irradiated positions of (N-2) spot beams 9a through 9g, 9i, 9j, 9l, and 9m other than the spot beams 9k and 9h and a difference between the Z position $f_h$ at the irradiated position of the spot beam 9h and the average value F are calculated for the sample shot 7A by the central control system 13. Assume now that the differences with respect to the Z positions at the irradiated positions (measurement positions) $f_k$ and $f_h$ of the spot beams 9k and 9h are ΔFk and ΔFh, respectively. The central control system 13 determines whether the differences ΔFk and ΔFh are within an allowable range e, respectively. When at least either the difference ΔFk or the difference ΔFh exceeds the allowable range e, the measured data of the sample shot 7A is excluded from an object of statistical processing. The same calculation is made also for the remaining sample shots 7B through 7I, and only the measured data of the remaining sample shots other than the excluded sample are statistically processed by the EGA method.

According to the aforementioned alignment method of the present invention, the Z position of the wafer mark is offset from the best focal position of the alignment sensor due to foreign matters such as resist dust particles that have adhered to the back surface of the wafer, and the measured data of a sample shot such as causing a jump of measured data can be excluded from an object of processing. Therefore, an overall accuracy of alignment can be enhanced without reducing throughput.

Another embodiment of the alignment method will next be described. In this embodiment, as with the aforementioned embodiment, the same calculation as the sample shot 7A is made also for the remaining sample shots 7B through 7I. Thereafter, a defective shot is excluded from an object of statistical processing which is performed by the EGA method. At the same time, a shot region which is adjacent to the defective shot is selected as a substantial shot, and the Z position of the wafer mark of the substitutional shot is determined by the same method as the shot region 8.

Figure 5:
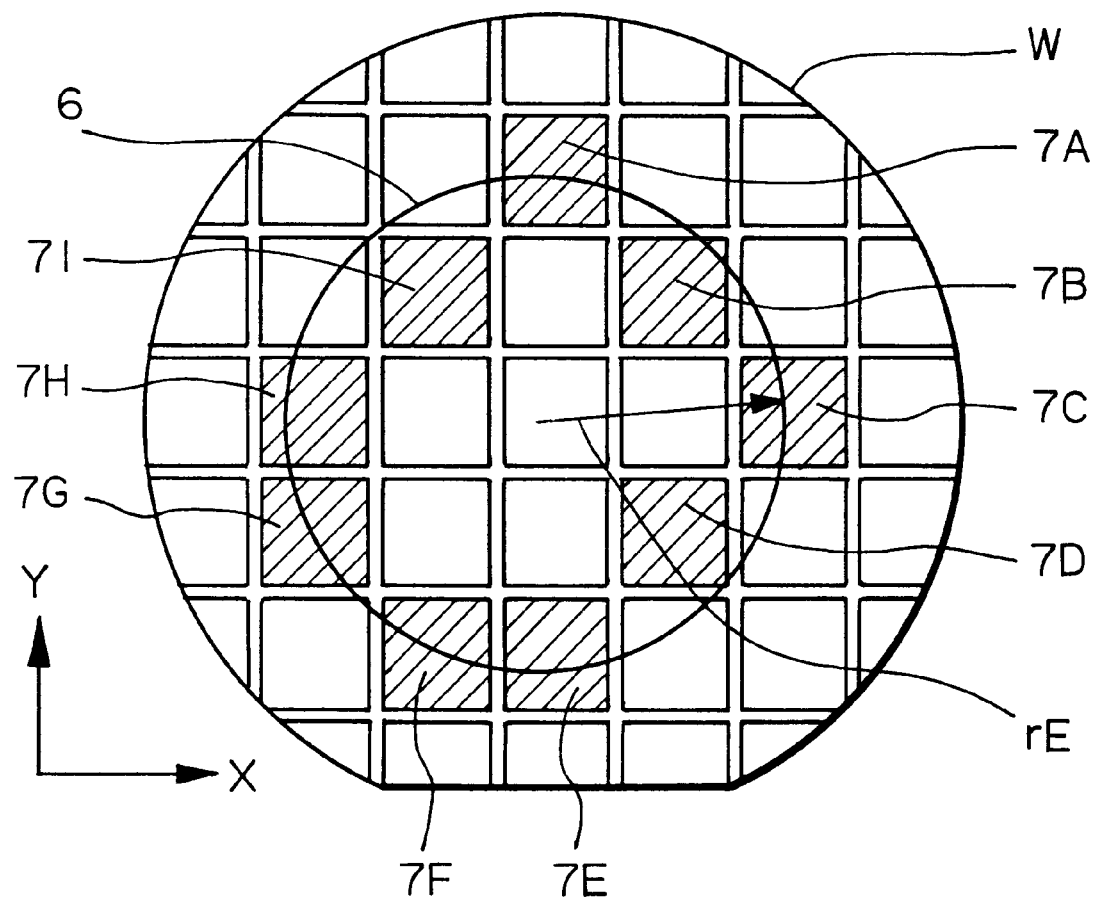
FIG. 5 is a plan view showing an example of an sample shot array on the wafer.
Figure 6A:
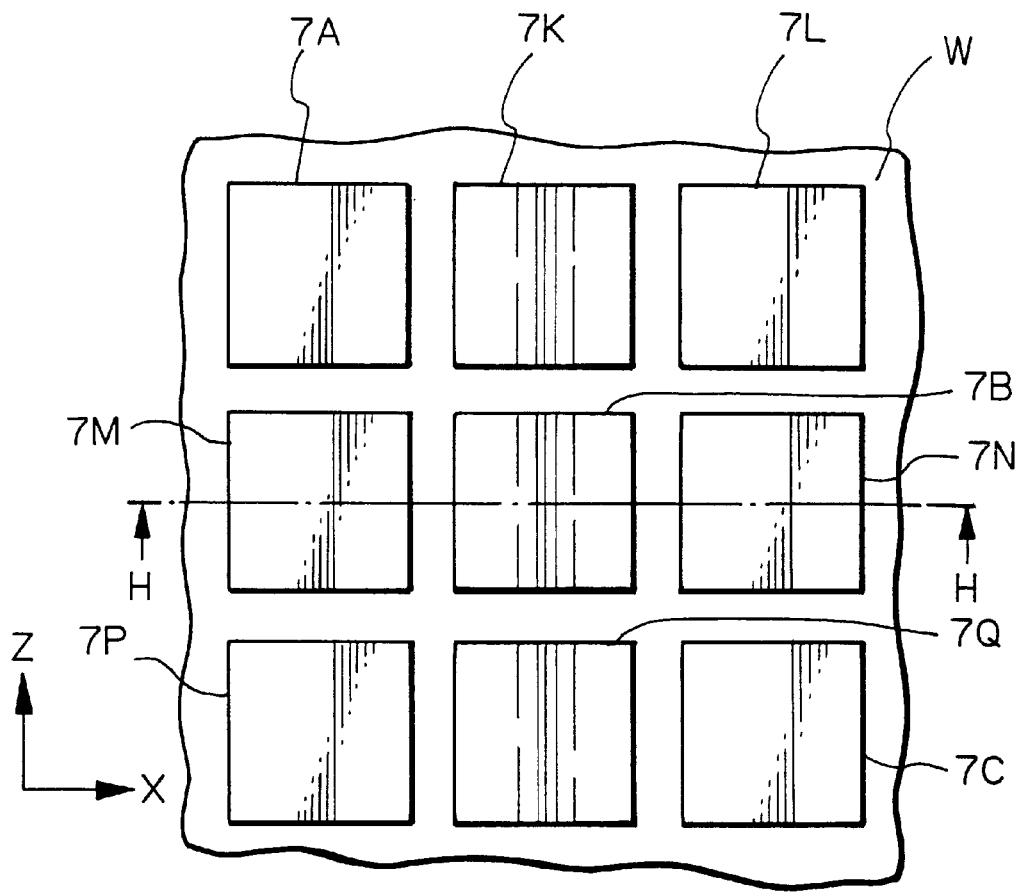
FIG. 6(a) is a plan view showing a defective shot detected by the present invention and eight shot areas which are adjacent to it.
Figure 6B:
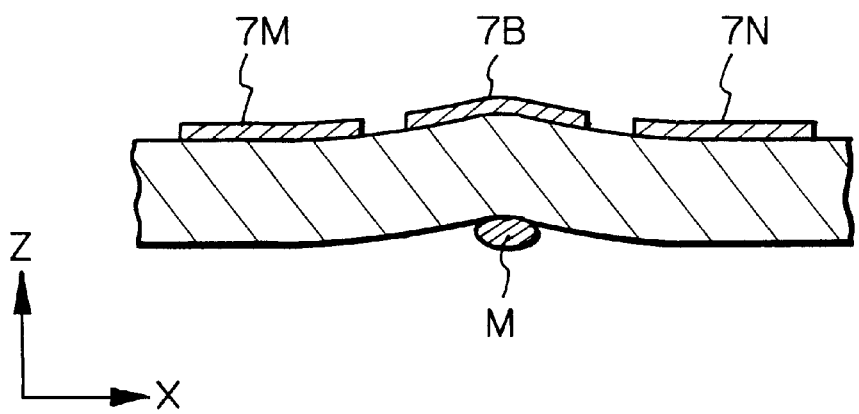
FIG. 6(b) is a sectional view taken along line H—H of FIG. 6(a).

FIG. 6(a) shows a plan view of the shot area around a defective shot, and FIG. 6(b) is a sectional view taken along line H—H of FIG. 6(b). In FIG. 6(a) there is shown the case where the sample shot 7B of FIG. 5 is defective. Adjacent eight shot areas 7A, 7K through 7N, 7P, 7Q, and 7C are shown in the vertical direction, horizontal direction, and oblique direction of the sample shot 7B. As shown in FIG. 6(b), because a foreign matter M such as a resist dust particle has adhered to the back surface of the sample shot 7B, the upper surface of the sample shot 7B is curved and the Z position of the central portion thereof becomes higher than that of the after portions adjacent to the left and right shot areas 7M and 7N, so the sample shot 7B becomes a defective shot. For this reason, the sample shot 7B is excluded from an object of statistical processing and a substitutional shot is selected. The substitutional shot is selected from among the 8 shot areas of FIG. 6(a). However, in this case the sample shots 7A and 7C which have previously been selected are excluded. When selecting the substitutional shot, it is selected so that the average radius (radius corresponding to a radius, rE, of FIG. 5) of a distribution of all sample shots which are the object of the statistical processing, including the substitutional shot, does not become less than a predetermined allowable radius. Therefore, from 6 shot areas exclusive of the shot regions 7A and 7C among 8 shot areas, a shot area where the distribution radius of the entire sample shots becomes largest is selected as a first substitutional shot. Then, the Z position of the first substitutional shot is examined. If the Z position is abnormal, it will be determined that the first substitutional shot is a defective shot, and the next substitutional shot will be selected. In a similar way, substitutional shots are selected in the order of their distance away from the center of the substrate, and the first shot where a normal Z position is obtained is selected as a substitutional shot which becomes an object of statistical processing.

According to the aforementioned alignment method of the present invention, a shot, which causes a jump of measurement at the time of alignment due to the influence of a foreign substance such as a resist dust particle on the back surface of a wafer, is excluded from an object of measurement, and a shot region near the excluded shot is selected as a substitutional shot. Therefore, an overall accuracy of alignment can be enhanced without reducing throughput.

In the aforementioned embodiment the difference between the Z position (spot beams 9k and 9h) of the wafer mark and the average value of the Z positions of the spot beams other than that Z position is obtained. However, in the case where an average surface of the wafer surface on an effective exposure field is obtained based on the Z positions of 13 spot beams 9a through 9m when alignment and exposure are performed and where the average surface is aligned with an image formation plane, a difference between the Z position (spot beams 9k and 9h) of the wafer mark and the Z position of the average surface determined from the Z positions of at the irradiated positions by 13 spot beams 9a through 9m may be obtained and it may be judged from the difference whether or not measured data can be used.

In addition, in the aforementioned embodiment, in FIG. 5 the positions of all sample shots 7A through 7I are actually measured and then the measured data of a sample shot where the Z position of the wafer mark is abnormal is excluded. Instead, the offset quantity between the Z position of the wafer mark and the Z position of another measured point may be detected by the focal position detecting system 2, 3 immediately before the measurement of the alignment sensor, and a sample shot where the offset quantity is large is not measured by the alignment sensor. With this, measuring time can be shortened.

While an alignment sensor of TTL type and LSA type has been employed in the aforementioned embodiment, the present invention is also applicable to the case where an alignment sensor of LIA type and TTL type is employed.

Thus, the present invention is not to be limited to the aforementioned embodiment, but various changes and modifications are possible within the scope of the present invention.

According to the first alignment method, when a difference between the height or level of the alignment mark measured at one measurement point of a plurality of measurement points and the level at another measurement point exceeds, for example, a predetermined allowable range, it is determined that the detected position of the alignment mark is unsuitable. Therefore, the position where there is a large offset between the level at the alignment mark (wafer mark) and the level at another region can be accurately detected, and a measured value which will includes an error is removed beforehand. Therefore, alignment accuracy is enhanced.

According to the second alignment method, a measured shot region (defective shot), where the difference between the detection result at a predetermined measurement point and the detection result at another measurement point exceeds an allowable range, is excluded from an object of statistical processing. Therefore, there is the advantage that alignment accuracy is enhanced.

Also, when the difference between the detected result of the height at the measurement point on the alignment mark of the shot area and the detection result of the height or level at another measured point exceeds a predetermined allowable range, the alignment mark of the measured shot region is not measured. In such a case the measuring time required for alignment is shortened and thus throughput is enhanced.

In addition, when a substitutional measured shot region is selected from the vicinity of the measured shot region excluded from an object of statistical processing, a defective shot can be removed without reducing the number of shots that are measured. For example, no focal offset occurs. Therefore, overall alignment accuracy can be enhanced.

Furthermore, when a substitutional measured shot area is selected from 8 shot regions or areas which are adjacent to the measured shot areas excluded from an object of statistical processing, one of the shot areas adjacent to the defective shot is selected as a substitutional shot area, so there is no deviation in the statistical distribution of the measured shot areas.

Moreover, when a substitutional measured shot area is selected so that an average radius of a distribution of the measured shot areas does not become less than a predetermined allowable radius, a reduction in statistical processing accuracy is avoided.

Figure 7:
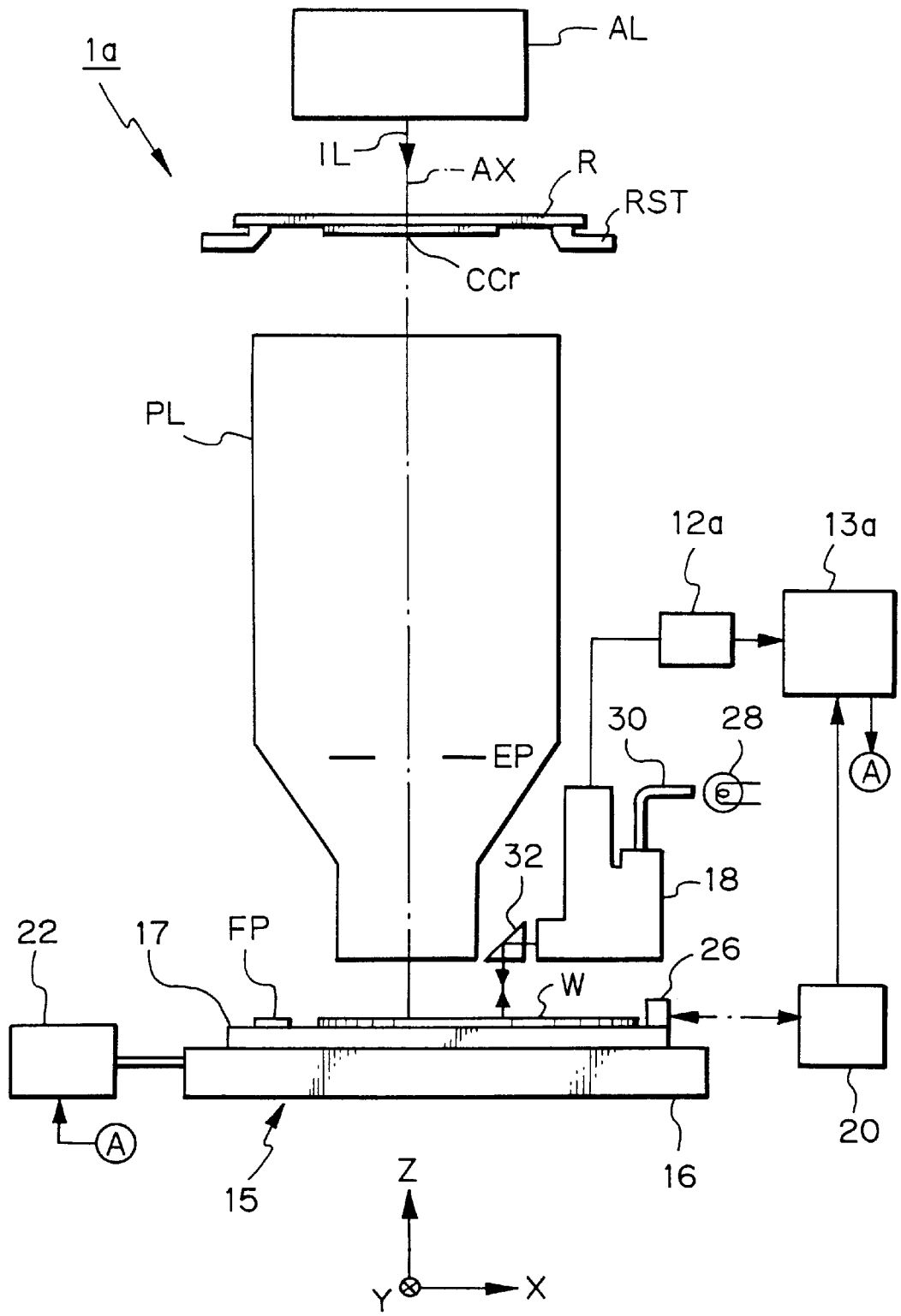
FIG. 7 is a schematic view showing another embodiment of the exposure apparatus according to the present invention.

Now, another embodiment of the exposure apparatus according to the present invention will be described with reference to FIGS. 7 through 13. FIG. 7 shows schematically an exposure apparatus 1a preferred as the embodiment of the present invention. This exposure apparatus 1a is a step-and-repeat type or contraction projection type exposure apparatus (the so-called stepper).

The exposure apparatus 1a comprises an illumination system AL for illuminating a reticle R used as a mask with an exposure light beam, a reticle stage RST which holds the reticle R, a projection optical system PL for projecting images of patterns formed on the reticle R to a wafer W used as a photosensitive substrate, an XY stage 16 which is movable in two dimensions in a reference plane (an XY plane shown in FIG. 7) under the projection optical system PL, a sample stage 17 for holding the wafer W mounted on the XY stage 16 and is capable of moving it within a minute range (for example, within a range of 100 mm) in the Z direction perpendicular to the XY plane and rotating it within a minute angular range, a sensor unit 18 including an off-axis type of alignment sensor which detects an alignment mark (wafer mark) formed as a position detecting mark on the wafer W and is integrated with a focus sensor, an alignment control unit 12a for calculating a focal position and a location of the alignment mark on the basis of output signals from the sensor unit 18 as described later, a laser interferometer 20 for measuring a location or position of the sample stage 17 in the XY plane, a driving system 22 for driving the XY stage 16 and the sample stage 17 in their moving directions respectively, and a main control unit 13a which includes a microcomputer (or mini-computer) to control the exposure apparatus as a whole collectively.

The illumination system AL comprises an illumination optical system including a light source (a mercury lamp, excimer laser or the like), a flyeye lens, a relay lens, condenser lens and so on. This illumination system AL illuminates patterns CCr on a lower surface of the reticle R (the surface on which the patterns are formed) with an exposure light beam IL from the light source with a uniform luminance distribution. A bright line such as the i-beam from a mercury lamp, excimer laser beam of KrF, ArF or the like is used as the exposure light beam IL.

The reticle R is fixed on the reticle stage RST, for example, by vacuum suction, and the reticle stage RST can be minutely driven by a driving system (not shown) in an X direction (a right-left direction on the paper surface of FIG. 7), a Y direction (a direction perpendicular to the paper surface of FIG. 7) and a q direction (a rotating direction in the XY plane). Accordingly, the reticle stage RST is capable of positioning the reticle R (reticle alignment) in a condition where a center of a pattern CCr on the reticle R (a reticle center) is almost aligned with an optical axis of the projection optical system PL (reticle alignment). FIG. 7 shows a condition where the reticle alignment has been completed.

Used as the projection optical system PL is an optical system which has an optical axis AX set in a direction along the Z axis perpendicular to a moving plane of the reticle stage RST, two telecentric side surfaces and a predetermined contracting magnification $\beta$ ($\beta$ is ⅕ for example). When the reticle R is irradiated with the illumination light beam IL in a condition that the pattern CCr on the reticle has been aligned with a shot region or area on the wafer W as described later, an image of the pattern CCr on the surface on which patterns are formed is projected at the contracting magnification $\beta$ by the projection optical system PL to the wafer W coated with a photoresist. Accordingly, a contracted image of the pattern is formed in each shot area on the wafer W.

The XY stage 16 is actually composed of a Y stage which moves on a base (not shown) in the Y direction (the direction perpendicular to the paper surface of FIG. 7) and an X stage which moves on the Y stage in the X direction (the right-left direction on the paper surface of FIG. 7). However, these stages are represented simply as the XY stage 16 in FIG. 7.

The sample stage 17 is mounted on the XY stage 16, and is slightly driven by the driving system 22 in the Z direction and the θ direction (a direction to rotate around the Z axis). The wafer W is fixed by suction to the sample stage 17 by way of a wafer holder (not shown).

Arranged on an upper surface of the sample stage 17 is a moving mirror 26 and disposed in opposition to a reflecting surface of the moving mirror 26 is the laser interferometer 20 which measures a location of the sample stage 17 in the XY plane by projecting a laser beam to the moving mirror 26 and receiving the reflected beam. Actually, the moving mirror is composed of an X moving mirror which has a reflecting surface perpendicular to the X axis and a Y moving mirror which has a reflecting surface perpendicular to the Y axis, and the laser interferometer is correspondingly composed of an X laser interferometer which measures a location in the X direction and a Y laser interferometer which measures a location in the Y direction. However, these mirrors and laser interferometers are represented simply as the moving mirror 26 and the laser interferometer 20 in FIG. 7. Therefore, it is assumed for the following description that a system of XY coordinates on the sample stage 17 is measured by the laser interferometer 20.

Fixed to the sample stage 17 is a reference plate FP so that its surface is set at the same height as that of the wafer W. Formed on the surface of the standard plate FP are various kinds of reference marks including a reference mark which is used for a baseline measurement (a measurement of a spacing between the optical axis AX of the projection optical system PL and the alignment sensors (described later) which compose the sensor unit 18).

Measured values obtained by the laser interferometer 20 are supplied to the main control unit 13a, and the main control unit 13a positions the sample stage 17 in the two dimensional XY directions by way of the driving system 22 and the XY stage 16 while monitoring the measured values from the laser interferometer 20. In addition, an output from a focus sensor of an oblique incidence type not shown (a focus sensor which performs a focus measurement within a range of an exposure field size and an adjustment of a focal position or level to an average focal position in the exposure field) is also supplied to the central or main control unit 13a. At an exposure time, the main control unit 13a drives the sample stage 17 in the Z direction (a focusing direction) by way of the driving system 22 on the basis of the output from the oblique incidence type focus sensor. The wafer W is positioned in the directions along the three X, Y and Z axes by way of the sample stage 17 as described above.

In this embodiment, the main control unit 13a brings the alignment sensors described later which may compose the sensor unit 18 into focus with an objective lens by controlling an amount of displacement of the sample stage 17 in the Z direction on the basis of focal position data supplied from an alignment control unit 12a described later. Further, the main control unit 13a aligns a center of each shot region on the wafer W with the optical axis AX of the projection optical system PL by driving the XY stage 16 stepwise while controlling operations of the driving system 22 on the basis of position data of a wafer mark (an alignment mark) detected by the alignment control unit 12a and exposes the pattern on the reticle R. These operations at the exposure time will be described later in more detail.

The sensor unit 18 described above is disposed beside the projection optical system PL, and may be composed of an off-axis type alignment sensor and a focus sensor which are integrated with each other. An illumination light beam is led into the sensor unit 18 from an external halogen lamp 28 by way of an optical fiber 30, various kinds of light bundles are projected from the sensor unit 18 to the wafer W by way of a prism mirror 32 and reflected beams are returned from the wafer W to the sensor unit 18 by way of the prism mirror 32. Furthermore, various kinds of detection signals are supplied from the sensor unit 18 to the alignment control unit 12a.

Figure 8:
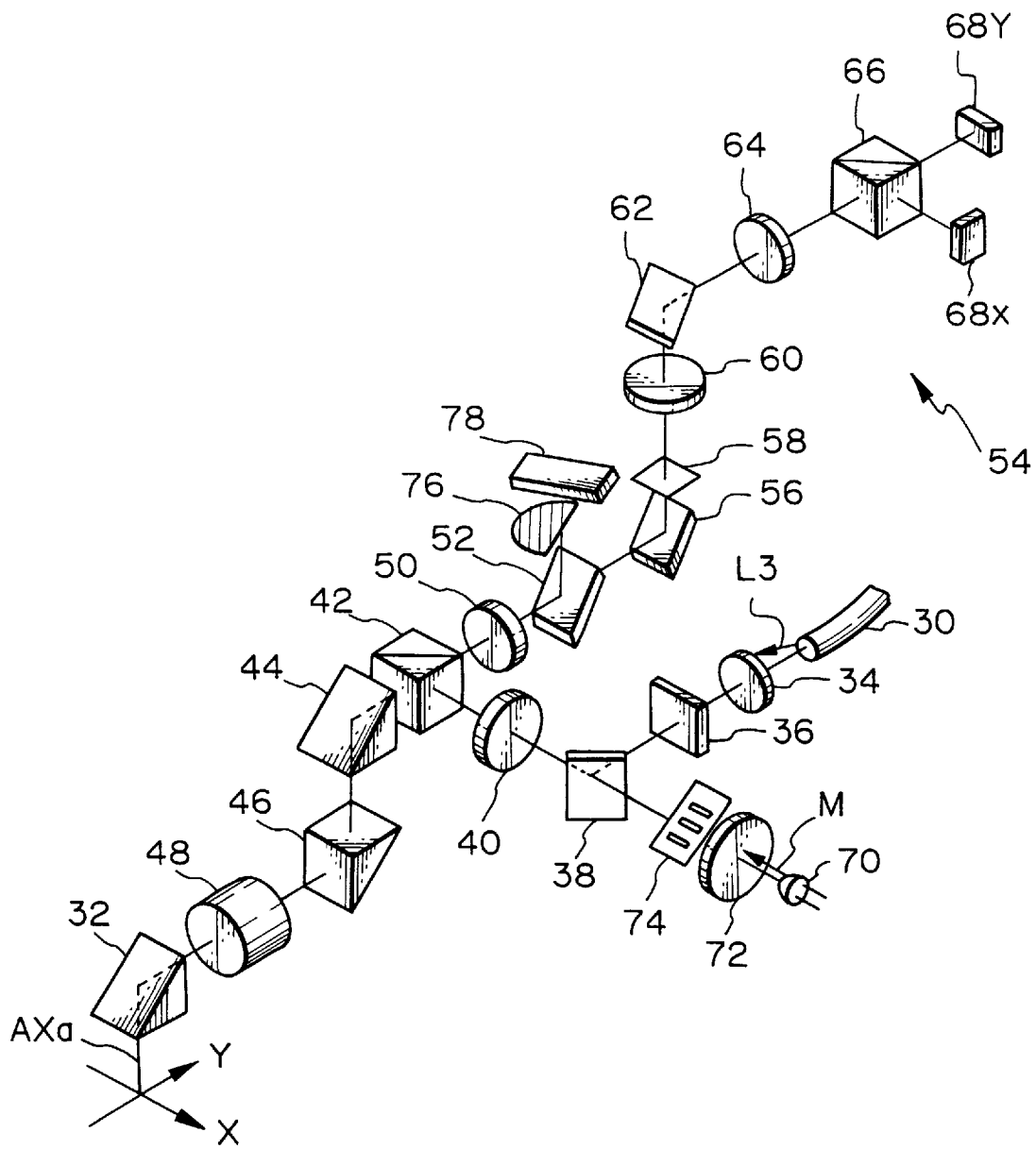
FIG. 8 is a perspective view showing a structure of a sensor unit shown in FIG. 7.

Now, detailed description will be made of the alignment sensor and the focus sensor which may compose the sensor unit 18 with reference to FIG. 8. An internal structure of the sensor unit 18 composed of the alignment sensor and the focus sensor is illustrated in FIG. 8.

Used as the alignment sensor in this embodiment is an FIA (field image alignment) type alignment sensor. This alignment sensor may be composed of an optical fiber 30, a condenser lens 34, a field stop plate 36, a dichroic mirror 38, a lens system 40, a beam splitter 42, prism mirrors 44 and 46, an objective lens 48 used as an objective optical system, a lens system 50, a dichroic mirror 52, a mirror 56, an index plate 58, an imaging relay lens 60, a mirror 62, a relay lens 64, a beam splitter 66, two-dimensional image pickup device 68X for the X axis and a two-dimensional image pickup device 68Y for the Y axis which are composed of two-dimensional CCDs or the like, and so on.

The components of the alignment sensor will be described below together with functions thereof.

An illumination light beam L3 of a broad band which is not photosensitive to the photoresist on the wafer W emerges from the optical fiber 30 and illuminates the field stop plate 36 with uniform luminance by way of the condenser lens 34. The illumination light beam which is limited by the field stop plate 36 is reflected by the dichroic mirror 38, allowed to pass through the lens system 40 and incident onto the beam splitter 42. An illumination light beam which is split due to reflection by the beam splitter 42 is sequentially reflected by the prism mirrors 44 and 46, and then illuminates a predetermined region on the wafer W by way of the objective lens 48 and the prism mirror 32. Let us assume that a wafer mark is present within the predetermined region in FIG. 8.

In this illumination light beam optical path for a wafer, the field stop plate 36 is conjugate (in imaging relationship) with the wafer W with regard to a composite system including the lens system 40 and the objective lens 48. Further, the illumination light beam L3 which has passed through the field stop plate 36 is an illumination light beam for an alignment system (FIA system) and a region of the wafer W to be illuminated by the FIA system is determined uniquely by a shape and size of an aperture formed in the field stop plate 36.

The illumination light beam emerging from the optical fiber 30 which are reflected by the wafer W (regularly reflected rays, scattered rays and so on) return to the beam splitter 42 through the prism mirror 32, the objective lens 48, and the prism mirrors 46 and 44. The light beam which is allowed to transmit through the beam splitter 42 (approximately ½ of the returning light beam) transmit through lens system 50 and the dichroic mirror 52, and travel toward a detector 54 of the FIA system adopted as a detection optical system. In the detector 54, the light beam from the dichroic mirror 52 forms an image of a wafer mark on the index plate 58 by way of the mirror 56. The light beam from this image and the light beam from an index mark on the index plate 58 form images of the wafer mark and the index mark on image pickup surfaces of the two-dimensional image pickup device 68X for the X axis and the two-dimensional image pickup device 68Y for the Y axis which consist of two-dimensional CCDs or the like respectively by way of an imaging relay lens 60, a mirror 62, a relay lens 64 and a beam splitter 66.

In a focused condition, the index plate 58 is disposed so as to be conjugate with an exposure surface of the wafer W with regard to a composite system consisting of the objective lens 48 and the lens system 50. Further, the index plate 58 and an image pickup surface of each of the image pickup devices 68X and 68Y are disposed so as to be conjugate with each other with regard to the lens systems 60 and 64. The index plate 58 is a transparent plate having an index mark which is made of chromium layer or the like formed thereon and a portion which remains transparent for forming an image of a wafer mark. Further, the index mark may be composed of an X axis index mark which is to be used as a position standard in a direction conjugate with the X axis on the wafer W and a Y axis index mark which is to be used as a position standard in a direction conjugate with the Y axis. The image pickup devices 68X and 68Y pick up at least either of an image of a wafer mark on the X axis and an image of a wafer mark on the Y axis as well as an image of the index mark, and an X coordinate (a relative position measured taking the center of the index as standard) of the wafer mark on the X axis and a Y coordinate (a relative position measured taking the center of the index as standard) of the wafer mark on the Y axis are determined by processing image pickup signals from the image pickup devices 68X and 68Y. Though a separate illumination system is actually disposed for illuminating the index plate 58 independently, it is omitted in FIG. 8.

A system composed of the objective lens 48 and the prism mirror 32 which are disposed on the side of the wafer W of the prism mirror 46 is referred to as a common objective system. This common objective system is used commonly to the alignment sensor and the focus sensor of the FIA system in this embodiment. The common objective system and lenses in the detector 54 of the FIA system after the mirror 56 are disposed coaxially along an optical axis AXa.

Then, description will be made of the focus sensor which composes the sensor unit 18.

The focus sensor comprises a light source 70 such as an LED (or a laser diode) for the focus sensor, a condenser lens 72, a slit plate 74, the dichroic mirror 38, the lens system 40, the beam splitter 42, the prism mirrors 44 and 46, the objective lens 48, the lens system 50, the dichroic mirror 52, a pupil limiting light shielding plate 76 and a line sensor 78 composed of a one-dimensional CCD or the like.

Now, the components and functions of the focus sensor will be described below.

A detection light beam M emitted from the light source 70 illuminates the slit plate 74 by way of the condenser lens 72. Formed on this slit plate 74 are focal position detecting patterns in a number which is the same as that of detection regions of an alignment sensor to be set within an observation visual field of the objective lens 48. The detection light beam M which has passed through the focal position detecting patterns of the slit plate 74 transmits through the dichroic mirror 38 and travels toward the beam splitter 42 by way of the lens system 40. In this embodiment, a light beam having a wavelength band in which the beam is not sensitive to the photoresist on the wafer W (for example, from a red beam to a near-infrared beam) is used as the detection light beam M and a wavelength selectivity of the dichroic mirror 38 is set to have such a characteristic as to reflect a light beam having a wavelength band to be used for the positional detection among the light beam L3 emerging from the optical fiber 30 and allow transmission of light beam having a wavelength band to be used for focal position detection among the detection light beam. In other words, the light beam for the positional detection and the light beam for focal position detection which irradiate the wafer W have different wavelength band so that the light beams produce no adverse influences on each other.

The light beam for the focal position detection which is reflected by the beam splitter 42 is irradiated to the wafer W after passing through the prism mirrors 44, 46, objective lens 48 and prism mirror 32. The slit plate 74 is substantially conjugate with the exposure surface of the wafer W with regard to the lens system 40 and the objective lens 48, and images or defocused images of the focal position detecting patterns of the slit plate 74 are projected to the exposure surface of the wafer W. The light beam which is reflected by the exposure surface of the wafer W returns to the beam splitter 42 by way of the prism mirror 32, objective lens 48, prism mirror 46 and prism mirror 44, and the light beam which has transmitted through the beam splitter 42 travels toward the dichroic mirror 52 by way of the lens system 50.

In contrast to the dichroic mirror 38, the dichroic mirror 52 has a wavelength selectivity which has such a characteristic as to transmit the position detecting light beam emerging from the optical fiber 30 and reflect the focal position detecting light beam emitted from the light source 70. Accordingly, focal position detecting light beam which is reflected by the dichroic mirror 52 pass outside the pupil limiting light shielding plate 76 which is disposed to destroy the telecentricity on the image side and form on the line sensor 78 again the images (or the defocused images) of the focal position detecting patterns projected to the wafer W. In other words, the exposure surface of the wafer W is substantially conjugate with the light receiving surface of the line sensor 78 with regard to the objective lens 48 and lens system 50. As understood from this fact, a focal position detection system may be composed, strictly speaking, of the condenser lens 72, slit plate 74, light intercepting plate 76 and line sensor 78 in this embodiment.

Figure 9:
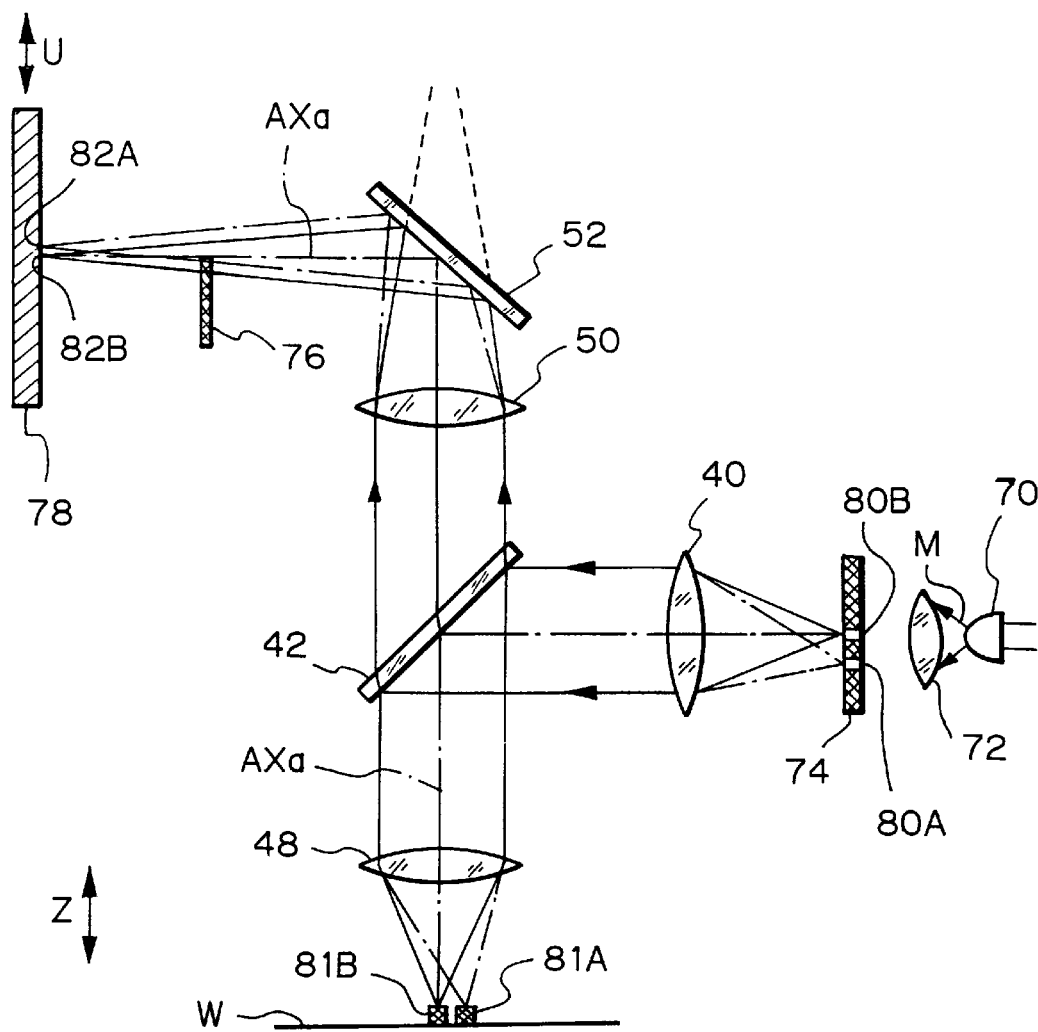
FIG. 9 is a schematic view showing a focus sensor shown in FIG. 8.

For facilitating to understand description, FIG. 9 shows only the focus sensor which is shown in FIG. 8. The optical path deflecting mirrors and other members which are shown in FIG. 8 are omitted in FIG. 9. Three focal position detecting patterns 80A, 80B and 80C, for example, are formed in the slit plate 74 as shown in FIG. 9 (however, the pattern 80C is omitted in FIG. 9). Images 81A, 81B and 81C (the image 81A not shown in FIG. 9) of these focal position detecting patterns 80A, 80B and 80C which are formed by the lens system 40 and the objective lens 48 are projected to the wafer W. Images 82A, 82B and 82C which are reimaged from the images 81A, 81B and 81C by the objective lens 48, lens system 50, dichroic mirror 52 and the light intercepting plate 76 (the image 82C not shown in FIG. 9) are projected to the line sensor 78.

Since the images 81A, 81B and 81C of the focal position detecting patterns are arranged almost on a straight line on the wafer W, the images 82A, 82B and 82C which are reimaged on the line sensor 78 are formed at different locations in a predetermined direction (referred to as a U direction). The pupil limiting light shielding plate 76 functions to shields the light beam from a lower half of the line sensor 78 which is disposed from the optical axis AXa in the U direction. In this case, a section on the side of the wafer W from the objective lens 48 is telecentric, whereas a section on the side of the line sensor 78 from the lens system 50 is not telecentric due to a function of the light intercepting plate 76. Therefore, locations or positions of the images 82A, 82B and 82C are offset in the U direction on the line sensor 78 when the wafer W displaces in parallel with the optical axis AXa (in the X direction) though locations of the images 81A, 81B and 81C of the focal position detecting patterns remain unchanged (the imaged are defocused) on the wafer W. By utilizing this positional offset, a location (focus position) of a corresponding measurement point on the wafer W in the Z direction is detected from lateral offset of the image on the line sensor 78 from a standard position in the U direction.

Figure 10:
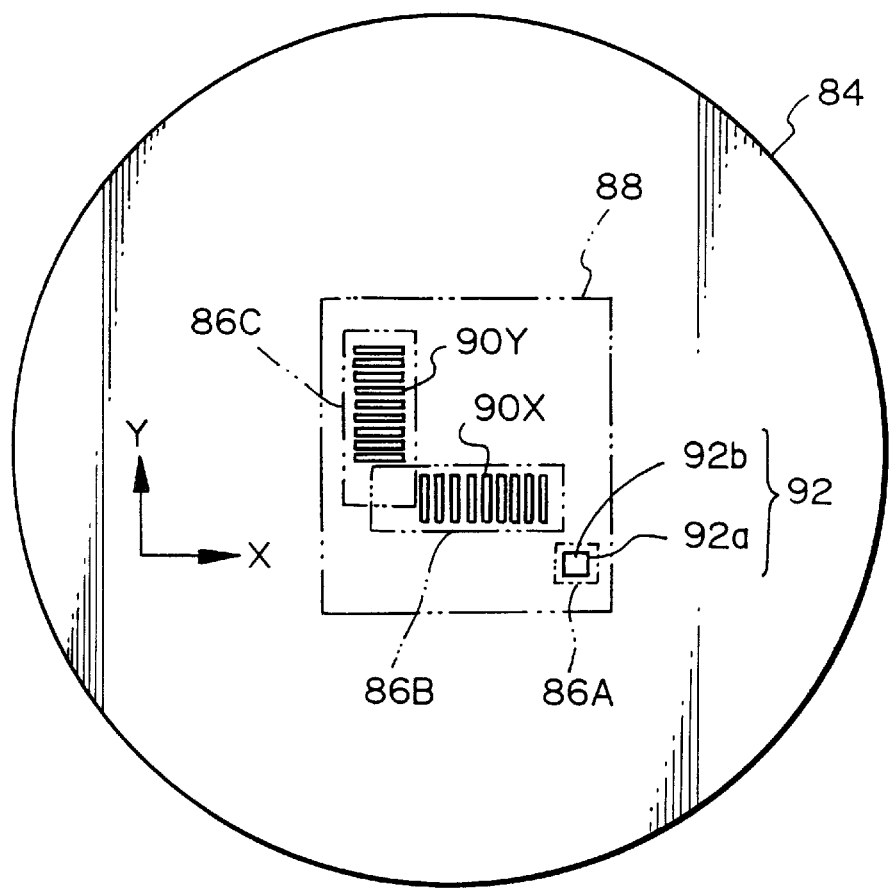
FIG. 10 is an enlarged plan view showing detection regions of an alignment sensor set on a wafer within a visual field of an objective lens.

Now, an example of observation visual field on the wafer which is detected by the alignment sensor by way of the objective lens 48 will be described with reference to FIG. 10. In FIG. 10, a circular region represents an observation visual field 84 of the objective lens 48 which is obtained on the wafer W. Three detection regions 86A through 86C are set in the observation visual field 84.

The detection regions 86A, 86B and 86C are detection regions for the alignment sensor. A rectangular region 88 within the observation visual field 84 represents an image pickup range for the image pickup devices 68X and 68Y. The detection region 86B represents a region within which an image is analyzed by the image pickup device 68X and the detection region 86C designates a region within which an image is analyzed by the image pickup device 68Y. Further, the detection region 86A denotes a region within which an image is analyzed by both the image pickup devices 68X and 68Y for measuring registration (overlaying) of the wafer W.

In FIG. 10, imaginary wafer marks to be detected in respective regions are traced within the detection regions 86A through 86C.

In concrete, a line-and-space pattern which is formed at a predetermined pitch in the X direction (hereinafter referred to as an "L/S" pattern) 90X is detected in the detection region 86B, whereas an L/S pattern 90Y which is formed at the predetermined pitch in the Y direction is detected in the detection region 86C. Further, a wafer mark 92 of a box-in-box type is detected in the detection region 86A. This wafer mark is composed of an inner box 92b and an outer box 92a.

Figure 11:
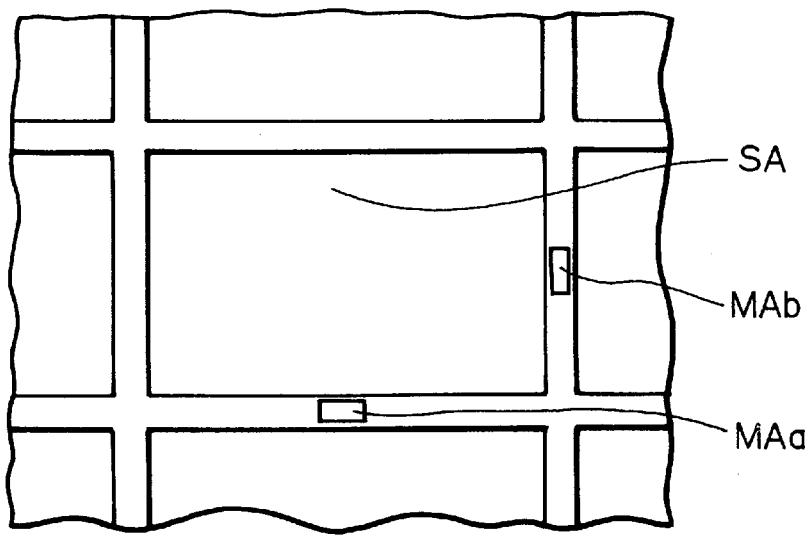
FIG. 11 is an enlarged view exemplifying a region of a wafer on which alignment marks are to be formed.

The L/S patterns 90X, 90Y and the mark 92 are formed in mark regions MAa and MAb respectively between a plurality of shot regions or areas SA on the wafer W, for example, as shown in FIG. 11.

The measurement of the registration is performed by determining positional offset quantities of an image of the outer box 92a and an image of the inner box 92b on the basis of image pickup signals obtained with the imagepickup devices 68X and 68Y respectively (see FIG. 8).

Figure 12:
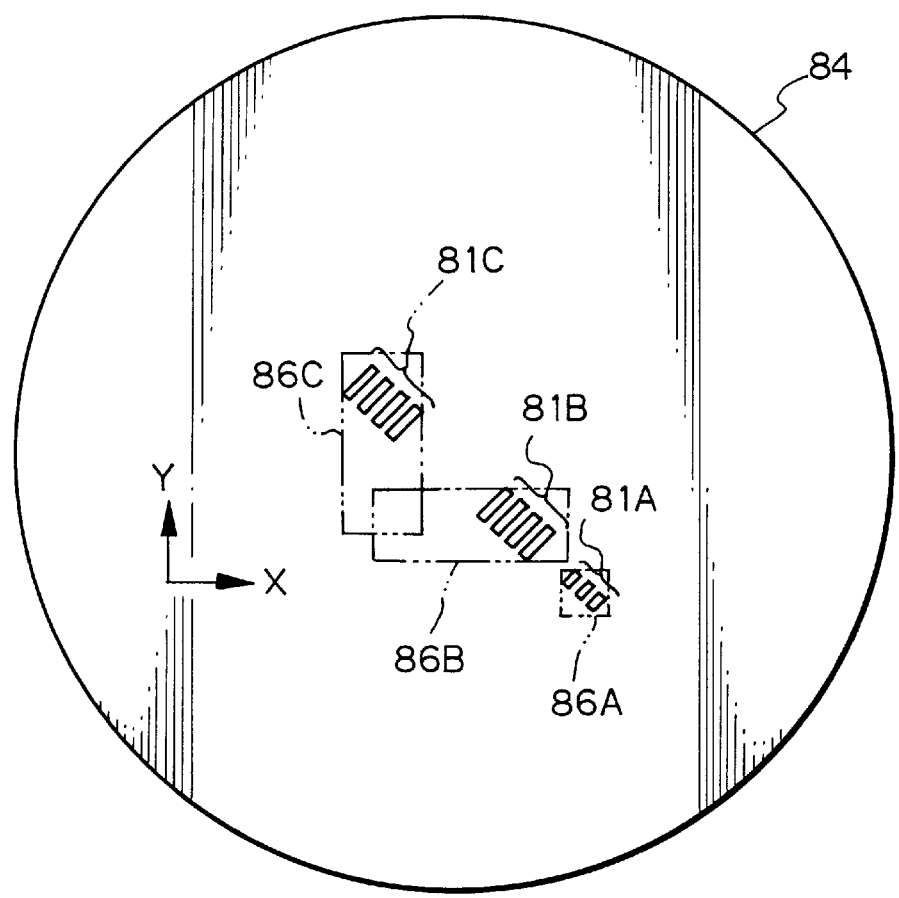
FIG. 12 is a plan view showing focal position detecting patterns projected to the detection regions respectively of the alignment sensor shown in FIG. 10.

FIG. 12 shows the pattern images 81A through 81C which are used for the focal position detection and are projected to the detection regions 86A through 86C respectively within the observation visual field 84. As shown in FIG. 12, the focal position detecting pattern images 81A through 81C which are projected to the detection regions 86A through 86C respectively are bright and dark patterns (multipatterns) which are formed at a predetermined pitch in a direction crossing the X axis at an angle of 45°.

Since the image patterns have shapes which cross the wafer marks detected in the respective detection regions in this case, any influence on the focal point detection due to the marks is reduced. Further, the focal point detecting patterns may be a single slit pattern.

Figure 13:
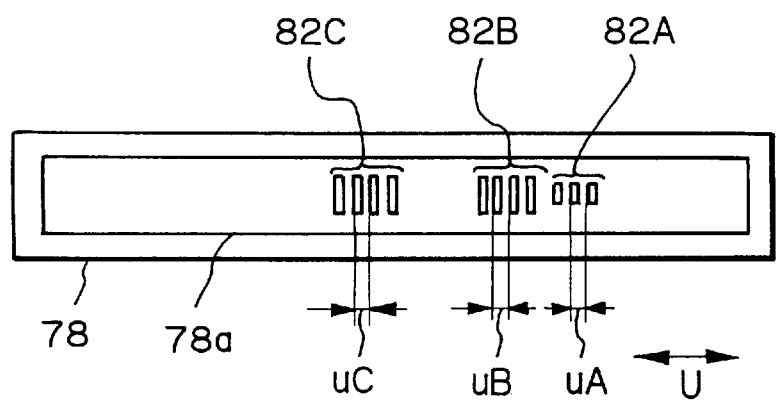
FIG. 13 is an enlarged view showing images which are formed again on a line sensor.

FIG. 13 shows pattern images 82A through 82C which are used for the focal position detection and are projected again to a light receiving surface 78a of the line sensor 78 (see FIG. 9) in correspondence to the focal position detecting pattern images shown in FIG. 12. In FIG. 13, light receiving elements are arranged on the light receiving surface 78a of the line sensor 78 in a direction indicated by an arrow U and the focal position detecting pattern images 82A through 82C of are projected to different locations in the direction indicated by the arrow U. Since the pattern images 82A through 82C of the patterns are bright and dark patterns formed at the predetermined pitch in the direction indicated by the arrow U, the locations of the pattern images 82A through 82C in the direction indicated by the arrow U can be determined by processing image pickup signals read out of the line sensor 78 with the alignment control unit 12a (see FIG. 7).

A positional offset of the region on the wafer W in which the wafer mark 92 is formed (see FIG. 10) is detected by determining a positional offset quantity uA of the pattern image 82A from a reference position in the direction indicated by the arrow U. A positional offset quantity of a region on the wafer W in which the L/S pattern 90X is formed (see FIG. 10) in the Z direction is detected by determining a positional offset quantity uB of the image 82B of the pattern from a standard position in the direction indicated by the arrow U. A positional offset quantity of a region on the wafer W in which the L/S pattern 90Y is formed (see FIG. 10) is detected by determining a positional offset quantity uC of the pattern image 82C from a standard position in the direction indicated by the arrow U.

A brief description will be made of an example of how to determine a reference position on the line sensor 78.

In case of an alignment sensor which is to be used in the FIA system, a reference mark for the reference mark plate FP (see FIG. 7) disposed, for example, in the detection region 86B and an image of the reference mark is picked up with the image pickup device 68X while changing a position of the reference mark plate FP in the Z direction. Then, image pickup signals from the image pickup device 68X are analyzed and the reference mark plate FP is positioned in the Z direction so that the image of the reference mark has highest contrast. The image 81B of the focal position detecting pattern is projected to the reference mark plate FP and the pattern image 82B is projected to the line sensor 78. A position of the pattern image 82B which is formed on the line sensor 78 at this time is selected as a reference position for the pattern image 82B. Reference positions for the pattern images 82A and 82C may be determined in the similar ways.

Further, it is possible to use a kind of two-dimensional image pickup device on which picture elements are arranged in a plurality of lines in parallel with the direction indicated by the arrow U as the line sensor 78 and detect pattern images on the line sensor by adding image pickup signals from the picture elements arranged in the plurality of lines. Furthermore, it is possible to dispose, before the light receiving surface of the line sensor 78, a cylindrical lens which has a function to condense light beams in a direction perpendicular to the direction indicated by the arrow U in FIG. 13.

If a magnification (a lateral magnification) of a composite system composed of the objective lens 48 and the lens system 50 which are disposed between the wafer W and the line sensor 78 is assumed to be $\gamma$ in FIG. 9, positional offset quantities of the regions on the wafer W in which the marks are formed from focused positions in the Z direction are determined as products of the lateral offset quantities uA through uC multiplied by $1/\gamma^2$. When a position of the wafer mark is detected, the position is detected with the alignment sensor after adjusting a position of the sample stage 17 shown in FIG. 7 so that a positional offset quantity of the wafer mark becomes zero. Accordingly, it is possible to detect the position of corresponding wafer marks with a high accuracy in precisely focused conditions in both the X and Y directions on the alignment sensor of the FIA system. When the wafer marks (for example, 90X and 90Y) are located in a plurality of detection regions (for example, 86B and 86C) at the same time which are set in the visual field of the objective lens 48, it is possible to simultaneously detect focus positions in regions in which marks are formed on the wafer W, thereby providing a merit to shorten a time required for detecting positions of the wafer marks in a plurality of regions (for example, 86B and 86C).

For further enhancing a focusing accuracy, automatic focusing may be performed by means of the servo system even while a positional measurement is carried out with the alignment sensor.

Description will be made of exposure operations of the exposure apparatus 1a preferred as the embodiment of the present invention which has the structure described above. Description will be made here of a case wherein a step-and repeat type of exposure is carried out by the EGA method which determines array coordinates of all shots on the wafer W by statistical calculations using the method of least squares, for example, on the basis of measured values of alignment mark positions on the wafer W and a design value of a shot array such as those disclosed by Japanese Patent Laid-Open Publication No. Sho 61-44429, and positions each shot area to an exposure position on the basis of the array coordinates. The content of the above Laid-Open Publication is hereby incorporated by reference.

In this case, it is assumed as a premise that reticle alignment with a reticle microscope (not shown) has been completed.

First, the main control unit 13a moves the sample stage 17 integrally with the XY stage 16 by way of the driving system 22 so that the reference mark FP is located under the projection optical system PL and an output of the laser interferometer 20 at this time is stored into an internal memory (not shown). Then, the main control unit 13a moves the sample stage 17 together with the XY stage 16 by way of the driving system 22 so that the reference mark plate FP is located under the prism mirror 32 (in the detection region on the alignment sensor in the sensor unit 18) and outputs of the alignment sensor in the sensor unit 18 and the laser interferometer 20 at this time are stored into the internal memory. A baseline measurement is carried out in this way. A sequence of the baseline measurement in the embodiment is similar to that in the conventional exposure apparatus and will not be described in details.

Successively, the main control unit 13a proceeds to a sequence to sequentially detect positions of the wafer marks on the basis of the output of the laser interferometer 20 and the output of the alignment sensor while monitoring the output of the laser interferometer 20 so that alignment marks (wafer marks) set in a predetermined plurality, for example on the order of 7 to 15, of specific shot areas (sample shots) on the wafer W are located under the prism mirror 32 (in the detection regions on the alignment sensor in the sensor unit 18) and sequentially positioning the sample stage 17 by way of the driving system 22.

At this sequence, the main control unit 13a detects, prior to a positional measurement of each wafer mark, a positional offset quantity (defocus quantity) of each mark region in the Z direction using a focus sensor as described above and judges whether or not the positional offset quantity exceeds a predetermined quantity. The main control unit 13a does not detect a location of a mark which is located in a mark region having a positional offset quantity in the Z direction exceeding the predetermined quantity and executes detection of mark locations only for those which are located in mark regions having positional offset quantities in the Z direction within the predetermined quantity on the basis of the output of the alignment sensor and the output of the laser interferometer 20. When the positions of the marks are detected as described above, the measurements can be terminated when a predetermined number (at least 6) of positions of the alignment marks have been detected, thereby making it possible to terminate the measurement in a time which is shorter than that which is required for measuring all sample shots.

Then, the main control unit 13a determines array coordinates of all the shots on the wafer W by the statistical calculations using the method of least squares (the so-called EGA method) disclosed in details by Japanese Patent Laid-Open Publication No. Sho 61-44429 with the measurement data of the positions of the at least 6 alignment marks and design data of the shot array.

Then, the main control unit 13a repeats stepping of the sample stage 17 and the exposure through open/close control of a shutter (not shown) in the illumination system AL while controlling a position of the sample stage 17 so that each shot region or area (corresponding to each semiconductor chip when, for example, a chip is taken from one shot) is sequentially positioned under the projection optical system PL on the basis of the detection results of the alignment marks described above and the baseline measurement results described above and while executing the autofocus operations at the same time on the basis of focus position detection signals from an oblique incidence type focus sensor (not shown). Overlaying exposure on each shot area on the wafer W by the step-and-repeat method is carried out in this way.

As clear from the foregoing description, a mark detecting device includes the alignment sensor (30 through 66, 68X and 68Y) and the alignment control unit 12a which are described above, a focusing device includes the focus sensor (32, 38 through 52, and 70 through 78), the sampling stage 17, the driving system 22 and the main control unit 13a, and a calculation device is composed of the main control unit 13a.

As understood from the foregoing description, the exposure apparatus 1a according to a preferred embodiment adopts the sensor unit 18 which is composed of the alignment sensor integrated with the focus sensor and is capable of detecting a defocus quantity in a minute region on the order of a detection region of the alignment sensor (a region of a detected mark) using the focus sensor. Further, the exposure apparatus is capable of detecting a position of an alignment mark (wafer mark) with the alignment sensor in a condition free from a defocusing (focused condition) by adjusting a position of the sample stage 17 in the Z direction on the basis of a measured result obtained with the focus sensor.

Prior to measurement of position of each wafer mark, a defocus quantity of the region in which the mark is present is measured and detection of the position locations of the mark in a mark region having a defocus quantity within a predetermined quantity is executed. Accordingly, the exposure apparatus is capable of excluding detection results of locations of the alignment marks which are formed in regions having a concavity and a convexity remarkably larger than that of other region, for example alignment marks which are formed in regions having a foreign matter such as dust adhering to surfaces thereof from basic data for calculations of shot array at a stage to determine array data of all shot regions on the wafer W by the EGA method. As a result, detected results of locations of only alignment marks which are free from adhered foreign matters and having defocus quantities within the predetermined quantity are used as the basic data for calculations of shot array, an array of shot areas calculated by the main control unit 13a is accurate and free from errors which are involved due to adhesion of foreign matters.

On the basis of the calculated array data of the shot areas, each shot area is sequentially positioned at predetermined exposure position on the wafer W and the image of a reticle pattern is sequentially exposed in a plurality of shot regions. Accordingly, the exposure apparatus makes it possible to maintain an overlaying accuracy at a level higher than that obtainable by the so-called die-by-die method while maintaining a high throughput even when a foreign matter is adhering to wafer surfaces.

Since the exposure apparatus is structured to use the objective lens 48 commonly to the alignment sensor and the focus sensor which compose the sensor unit 18, it suppresses influences on focal position detection due to a change of an optical characteristic of the objective lens 48 even if the characteristic changes.

Since the pupil limiting light shielding plate 76 which destroys telecentricity of reflected light beams is disposed at a stage to receive reflected light beams from the wafer W into the detection system composing the focus sensor, the exposure apparatus having a simple configuration is capable of detecting displacements of wafer mark regions (defocus quantities) which are converted into lateral offset quantities of reimaged images.

In the embodiment has been described above, from a viewpoint to take much of a throughput, wafer marks in a plurality of specific shots (sample shots) are preliminarily determined as objects to be detected, and position of the wafer marks which are determined as the objects are detected in focused conditions only when focal position offset quantities detected by the focus sensors are within the predetermined quantity and an array of shot area is calculated by statistical processing using the method of least squares at a stage where a predetermined number of positional detection results are obtained. However, exposure apparatus according to the present invention is not limited to this embodiment, but may be modified, for example, so as to determine a plurality of specific wafer marks as objects to be detected, sequentially detect positions of the plurality of specific wafer marks in focused conditions and calculate an array of shot areas by the statistical processing using the method of least squares only with detection results of marks having focal position offset quantities (defocus quantity) within a predetermined quantity. In this case, control contents become relatively simple at a step to detect locations of the marks since it is unnecessary to judge whether or not the focal position offset quantities are within the predetermined quantity at this stage.

Though the image pickup devices 68X and 68Y (see FIG. 8) which compose the alignment sensor in the FIA system are streuctred to pick up an image within the same range of the visual field of the objective lens 48 and analyze images in different regions within an entire image pickup range, it is possible to differentiate image pickup ranges proper between the image pickup devices 68X and 68Y.

When it is sufficient to measure a focal position only within the detection region 86B shown in FIG. 10, it is possible to shield the focal point detecting patterns 80A and 80C other than the focal position detecting pattern 80B with shutters (not shown) or dispose an illumination light source for each of the focal position detecting patterns 80A, 80B and 80C, and illuminate only a specific pattern by controlling light emission from these light sources. Alternately, it is possible to dispose a liquid crystal panel in place of the slit plate 74 and generate only a specific focal position detecting pattern by setting only a desired location of this liquid crystal panel (corresponding to any one of the focal point detecting patterns 80A, 80B and 80C) at a light transmitting section.

Though the embodiment is described for a case where the alignment sensor disposed in the FIA system is used as an alignment sensor, the present invention is not limited to this embodiment. An LIA (laser interferometric alignment) type alignment sensor or an LSA (laser step alignment) type alignment sensor may be used as a detection optical system of a mark detection device and it is possible to use a plurality of alignment sensors at the same time by selecting an adequate combination of the alignment sensors mentioned above. In a case the FIA system and the LIA system, for example, are used at the same time in a combination, however, it is necessary to make such a contrivance as to dispose, between the mirror 62 and the relay lens 64 shown in FIG. 2, a wavelength selection filter which cuts off laser beam reflected by the wafer W when the LIA system is used.

As understood from the foregoing description, the exposure apparatus according to the present invention exhibits a conventionally unavailable excellent effect that it is capable of maintaining a high throughput and a high overlaying accuracy even when foreign matters are adhering to surfaces of photosensitive substrates.

In addition to the effect described above, the exposure apparatus according to the present invention provides an effect that it makes it possible to accurately detect defocused conditions of the alignment mark regions free from influences due to changes in imaging characteristics of objective optical systems.

In addition to the effects described above, the exposure apparatus according to the present invention provides an effect that it has a simple structure and is capable of detecting defocused conditions of the aligning mark regions (displacements in a direction of height) which are converted into lateral offsets of reimaged images.

The content of Japanese Patent Application Nos. 225017/1995 and 225018/1995 filed on Sep. 1, 1995 in Japan and Japanese Patent Application No. 342550/1996 filed on Dec. 6, 1996 in Japan are hereby incorporated by reference.

What is claimed is:

1. An alignment method for aligning each of a plurality of shot areas on a substrate with a predetermined coordinate system, said method comprising steps of:

selecting a predetermined number of shot areas from said plurality of shot areas as sample shots;

measuring the coordinate position of an alignment mark provided for each of said predetermined number of sample shots;

irradiating, for every sample shot, a light beam to each of the measurement points which are set on a plurality of points on and around said alignment mark to measure the levels of said substrate at said plurality of measurement points;

comparing, for every sample shot, the measured levels at the measurement points set on said alignment mark with the measured levels at the other measurement points and determining whether or not the measured levels at the measurement points set on said alignment mark have an error; and excluding one or more sample shots in which the measured levels at the measurement points set on said alignment mark have an error and calculating an array coordinate of the shot areas on said substrate based on the coordinate position of the other sample shots.

2. A method according to claim 1, further comprising a step of selecting a sample shot which is present around the excluded sample shot as a substitute shot.

3. A method according to claim 2, further comprising steps of:

measuring the coordinate position of an alignment mark provided for said substitute shot;

irradiating a light beam to each of measurement points which are set on a plurality of points on and around said alignment mark of said substitute shot to measure the levels of said substrate at said plurality of measurement points; and comparing the measured levels at the measurement point set on said alignment mark of said substitute shot with the measured levels at the other measurement points and determining whether or not the measured levels at the measurement points set on said alignment mark have an error.

4. A method according to claim 2, wherein said substitute shot is selected so that a radius of distribution, on the substrate, of the sample shot which is used for calculating said array coordinate is less than a predetermined radius.

5. A method according to claim 1, wherein the array coordinate of the shot area on said substrate is calculated by statistically processing the coordinate position of the other sample shots.

6. A method according to claim 1, wherein if the difference between the measured levels at measurement points set on said alignment mark and the average of the measured levels at the other measurement points exceeds a predetermined allowable range, it is determined that the measured levels at the measurement points on said alignment mark have an error.

7. A method according to claim 1, wherein irradiation of said light beam and reception of the reflected light beams are performed by way of an optical system which is the same as an objective optical system executing said step of detecting the coordinate position.

8. A method according to claim 7, wherein telecentricity of said reflected light beam is destroyed at a stage to receive said reflected light beam.

9. An alignment method for aligning a substrate comprising steps of:

detecting the position of an alignment mark formed on the substrate;

irradiating, for every sample shot, a light beam to each of the measurement points which are set on a plurality of points on and around said alignment mark to measure the levels of said substrate at said plurality of measurement points;

comparing the measured levels at the measurement points set on said alignment mark with the measured levels at the other measurement points; and determining, based on the compared results, whether or not positional information of said alignment mark is used for alignment of said substrate.

10. A method according to claim 9, wherein if the difference between the measured levels at measurement points set on said alignment mark and the average of the measured levels at the other measurement points exceeds a predetermined allowable range, it is determined that the measured levels at the measurement points on said alignment mark have an error.

11. A method according to claim 10, wherein irradiation of said light beam and reception of the reflected light beams are performed by way of an optical system which is the same as an objective optical system executing said step of detecting the alignment mark.

12. A method according to claim 11, wherein telecentricity of said reflected light beam is destroyed at a stage to receive said reflected light beam.

13. An alignment method for aligning each of a plurality of shot areas on a substrate with a predetermined coordinate system, said method comprising steps of:

selecting predetermined number of shot areas from said plurality of shot areas as sample shots;

irradiating, for every sample shot, a light beam to each of the measurement points which are set on a plurality of points on and around said alignment mark to measure the levels of said substrate at said plurality of measurement points;

comparing, for every sample shot, the measured levels at the measurement points set on said alignment mark with the measured levels at the other measurement points and determining whether or not the measured levels at the measurement points set on said alignment mark have an error;

excluding one or more sample shots in which measured levels at the measurement points set on said alignment mark have an error and measuring the coordinate positions of the alignment marks of the other sample shots; and calculating an array coordinate of the shot areas on said substrate based on said measured coordinate position.

14. A method according to claim 13, further comprising a step of selecting a sample shot which exists around the excluded sample shot as a substitute shot.

15. A method according to claim 13, wherein the array coordinate of the shot area on said substrate is calculated by statistically processing the coordinate position of the other sample shots.

16. A method according to claim 13, wherein if the difference between the measured levels at measurement points set on said alignment mark and an average of the measured levels at the other measurement points exceeds a predetermined allowable range, it is determined that the measured levels at the measurement points on said alignment mark have an error.

17. An alignment method for aligning a substrate having a plurality of alignment marks formed thereon, comprising steps of:

measuring respective levels of the places where said alignment marks are formed;

determining, based on the measured results, whether or not positional information of said alignment mark is used; and excluding one or more alignment makes which are determined not to be used, from said plurality of alignment marks and aligning said substrate based on the positional information of the other alignment marks.

18. An exposure apparatus for transferring a pattern on a mask to a photosensitive substrate comprising:

an alignment system for detecting the position of an alignment mark by irradiating an alignment light beam to said alignment mark formed on said photosensitive substrate;

a position detecting system irradiating measuring beams to said measurement points, respectively, which are set in a plurality of points on and around an illumination position of said alignment light and measuring levels of said photosensitive substrate at a plurality of measurement points, respectively; and a determining device for determining whether or not the measured levels at the measurement points set in said illumination position of said alignment light by comparing the measured levels at the measurement points set in said illumination position and the measured levels the other measurement points.

19. An exposure apparatus according to claim 18, wherein said position detecting system performs irradiation of said light beam and reception of the reflected light beam by way of an optical system which is the same as an objective optical system of said alignment system.

20. An exposure apparatus according to claim 19, wherein telecentiricity of said reflected light beam is destroyed at a stage to receive said reflected light beam.

* * * * *